(12) United States Patent
Veal et al.

(10) Patent No.: US 9,317,892 B2
(45) Date of Patent: Apr. 19, 2016

(54) METHOD AND DEVICE TO AUGMENT VOLATILE MEMORY IN A GRAPHICS SUBSYSTEM WITH NON-VOLATILE MEMORY

(75) Inventors: Bryan E. Veal, Beaverton, OR (US); Travis T. Schluessler, Berthoud, CO (US); Murali Ramadoss, Folsom, CA (US); Balaji Vembu, Folsom, CA (US)

(73) Assignee: INTEL CORPORATION, Santa Clara, CA (US)

( * ) Notice: Subject to any disclaimer, the term of this patent is extended or adjusted under 35 U.S.C. 154(b) by 333 days.

(21) Appl. No.: 13/977,261

(22) PCT Filed: Dec. 28, 2011

(86) PCT No.: PCT/US2011/067489
§ 371 (c)(1),
(2), (4) Date: Jun. 28, 2013

(87) PCT Pub. No.: WO2013/100935
PCT Pub. Date: Jul. 4, 2013

(65) Prior Publication Data
US 2014/0198116 A1    Jul. 17, 2014

(51) Int. Cl.
*G09G 5/39* (2006.01)
*G06T 1/60* (2006.01)
*G11C 16/34* (2006.01)

(52) U.S. Cl.
CPC ............... *G06T 1/60* (2013.01); *G11C 16/349* (2013.01)

(58) Field of Classification Search
CPC ... G09G 5/36–5/399; G06T 1/20; G06T 1/60; G06T 15/005
See application file for complete search history.

(56) References Cited

U.S. PATENT DOCUMENTS

| | | | | |
|---|---|---|---|---|
| 5,790,137 | A | * | 8/1998 | Derby et al. ................ 345/557 |
| 5,983,073 | A | * | 11/1999 | Ditzik ....................... 455/11.1 |
| 6,184,907 | B1 | | 2/2001 | Min |
| 6,816,163 | B2 | * | 11/2004 | Antila ........................ 345/545 |

(Continued)

FOREIGN PATENT DOCUMENTS

WO      2013/100935 A1    7/2013

OTHER PUBLICATIONS

International Search Report and Written Opinion received for PCT Patent Application No. PCT/US2011/067489, mailed on Aug. 31, 2012, 10 pages.

(Continued)

*Primary Examiner* — Charles Tseng
(74) *Attorney, Agent, or Firm* — Hanley, Flight & Zimmerman, LLC

(57) ABSTRACT

Methods and devices to augment volatile memory in a graphics subsystem with certain types of non-volatile memory are described. In one embodiment, includes storing one or more static or near-static graphics resources in a non-volatile random access memory (NVRAM). The NVRAM is directly accessible by a graphics processor using at least memory store and load commands. The method also includes a graphics processor executing a graphics application. The graphics processor sends a request using a memory load command for an address corresponding to at least one static or near-static graphics resources stored in the NVRAM. The method also includes directly loading the requested graphics resource from the NVRAM into a cache for the graphics processor in response to the memory load command.

20 Claims, 13 Drawing Sheets

(56) References Cited

U.S. PATENT DOCUMENTS

| | | | |
|---|---|---|---|
| 6,894,695 B2* | 5/2005 | vanWelzen | 345/582 |
| 7,123,212 B2* | 10/2006 | Acharya et al. | 345/2.1 |
| 7,489,318 B1* | 2/2009 | Wilt | 345/582 |
| 7,971,081 B2 | 6/2011 | Cooper et al. | |
| 2006/0119606 A1* | 6/2006 | Nishihata et al. | 345/545 |
| 2008/0030512 A1* | 2/2008 | Jiao et al. | 345/506 |
| 2008/0117224 A1* | 5/2008 | Kimura | 345/531 |
| 2010/0026694 A1 | 2/2010 | Kato et al. | |
| 2010/0188412 A1 | 7/2010 | Li et al. | |
| 2011/0182115 A1* | 7/2011 | Yoon et al. | 365/163 |
| 2011/0185208 A1 | 7/2011 | Iwamoto et al. | |

OTHER PUBLICATIONS

International Preliminary Report on Patentability received for PCT Patent Application No. PCT/US2011/067489, mailed on Jul. 10, 201, 8 pages.

* cited by examiner

METHOD AND DEVICE TO AUGMENT VOLATILE MEMORY IN A GRAPHICS SUBSYSTEM WITH NON-VOLATILE MEMORY

FIELD OF THE INVENTION

The invention relates to executing computer graphical applications using volatile memory augmented with non-volatile memory.

DESCRIPTION OF THE RELATED ART

Memory performance and capacity requirements continue to increase across many aspects of the computing industry. In addition, memory power requirements and memory cost have become a significant component of the overall power and cost, respectively, of a given computing system ranging from a smart phone to a server. Memory and storage subsystems can increase or decrease the overall performance of a computing device depending on implementation specifics. Because it is generally desirable to have faster performing computing devices that utilize less power and cost less, a wide variety of designs of the memory and storage subsystems exist that attempt to maximize end user perceived performance while minimizing cost and power consumption. One area of applications utilized within computing devices that often is performance intensive for the memory and storage subsystems is in graphical applications, such as 3D graphics and multimedia.

BRIEF DESCRIPTION OF THE DRAWINGS

The following description and accompanying drawings are used to illustrate embodiments of the invention. In the drawings.

DETAILED DESCRIPTION

Many embodiments described below resolve 3D graphics and multimedia challenges introduced to the memory and storage subsystems of a computing device by subdividing the performance requirement and the capacity requirement between diverse memory technologies. The focus of this approach is on providing performance with a relatively small amount of a higher-speed memory such as dynamic random access memory (DRAM) while implementing the bulk of the system memory using a significantly cheaper and denser non-volatile memory. Several embodiments described below define platform configurations that enable hierarchical memory subsystem organizations for the use of the non-volatile memory, to augment volatile memory, by one or more graphics processors in a computing device. The use of the non-volatile memory in the memory hierarchy additionally allows non-volatile memory mass storage implementations as a substitute for standard mass storage drives.

Figure 1:
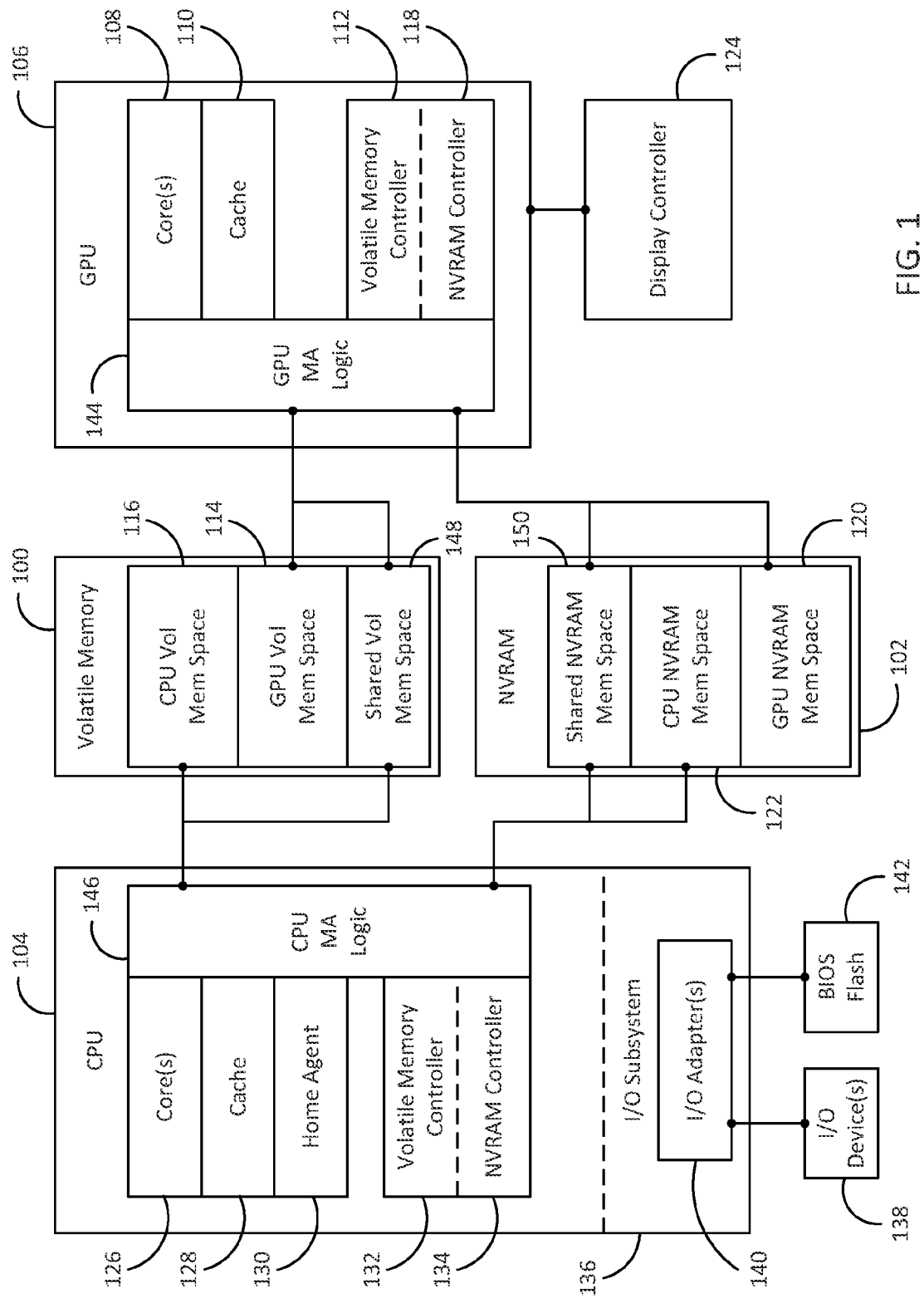
FIG. 1 illustrates a memory arrangement that allows a central processing unit (CPU) and a graphics processing unit (GPU) access to both volatile and non-volatile forms of memory according to several embodiments.

FIG. 1 illustrates a memory arrangement that allows a central processing unit (CPU) and a graphics processing unit (GPU) access to both volatile and non-volatile forms of memory according to several embodiments. The CPU and GPU can also be referred to as "processors" throughout this document. Both nomenclatures are utilized. FIG. 1 shows a volatile memory 100 and a non-volatile random access memory (NVRAM) 102 that are both accessible by CPU 104 and GPU 106. An overview of NVRAM is provided below.

1.A. Non-Volatile Random Access Memory Overview

There are many possible technology choices for NVRAM, including PCM, Phase Change Memory and Switch (PCMS) (the latter being a more specific implementation of the former), byte-addressable persistent memory (BPRAM), storage class memory (SCM), universal memory, Ge2Sb2Te5, programmable metallization cell (PMC), resistive memory (RRAM), RESET (amorphous) cell, SET (crystalline) cell, PCME, Ovshinsky memory, ferroelectric memory (also known as polymer memory and poly(N-vinylcarbazole)), ferromagnetic memory (also known as Spintronics, SPRAM (spin-transfer torque RAM)), STRAM (spin tunneling RAM), magnetoresistive memory, magnetic memory, magnetic random access memory (MRAM), and Semiconductor-oxide-nitride-oxide-semiconductor (SONOS, also known as dielectric memory).

NVRAM has the following characteristics:

It maintains its content even if power is removed, similar to FLASH memory used in solid state disks (SSD), and different from SRAM and DRAM which are volatile;

it has lower overall power consumption than volatile memories such as SRAM and DRAM;

it has random access similar to SRAM and DRAM (also known as randomly addressable);

it is rewritable and erasable at a lower level of granularity (e.g., byte level) than FLASH found in SSDs (which can only be rewritten and erased a "block" at a time—minimally 64 Kbyte in size for NOR FLASH and 16 Kbyte for NAND FLASH);

it is used as a system memory and allocated all or a portion of the system memory address space;

it is capable of being coupled to the CPU over a bus (also interchangeably referred to as an interconnect or link) using a transactional protocol (a protocol that supports transaction identifiers (IDs) to distinguish different transactions so that those transactions can complete out-of-order) and allowing access at a level of granularity small enough to support operation of the NVRAM as system memory (e.g., cache line size such as 64 or 128 byte). For example, the bus/interconnect may be a memory bus (e.g., a double data rate (DDR) bus such as DDR3, DDR4, etc.) over which is run a transactional protocol as opposed to the non-transactional protocol that is normally used. As another example, the bus may one over which is normally run a transactional protocol (a native transactional protocol), such as a PCI express (PCIE) bus, desktop management interface (DMI) bus, or any other type of bus utilizing a transactional protocol and a small enough transaction payload size (e.g. cache line size such as 64 or 128 byte); and it also has one or more of the following characteristics:

it has faster write speed than non-volatile memory/storage technologies such as FLASH;

it has very high read speeds (faster than FLASH and near or equivalent to DRAM read speeds);

it is directly writable (rather than requiring erasing (overwriting with 1 s) before writing data like FLASH memory used in SSDs); and/or it allows a greater number of writes before failure (more than boot ROM and FLASH used in SSDs).

As mentioned above, in contrast to FLASH memory, which must be rewritten and erased a complete "block" at a time, the level of granularity at which NVRAM is accessed in any given implementation may depend on the particular memory controller and the particular memory bus or other type of bus to which the NVRAM is coupled. For example, in some implementations where NVRAM is used as system memory, the NVRAM may be accessed at the granularity of a cache line (e.g., a 64-byte or 128-Byte cache line), notwithstanding an inherent ability to be accessed at the granularity of a byte, because cache line is the level at which the memory subsystem accesses memory. Thus, when NVRAM is deployed within a memory subsystem, it may be accessed at the same level of granularity as DRAM used in the same memory subsystem. Even so, the level of granularity of access to the NVRAM by the memory controller and memory bus or other type of bus is smaller than that of the block size used by Flash and the access size of the I/O subsystem's controller and bus.

NVRAM may also incorporate wear leveling algorithms to account for the fact that the storage cells begin to wear out after a number of write accesses, especially where a significant number of writes may occur such as in a system memory implementation. Since high cycle count blocks are most likely to wear out in this manner, wear leveling spreads writes across the far memory cells by swapping addresses of high cycle count blocks with low cycle count blocks. Note that most address swapping is typically transparent to application programs because it is handled by hardware, lower-level software (e.g., a low level driver or operating system), or a combination of the two.

The NVRAM 102 is distinguishable from other instruction and data memory/storage technologies in terms of its characteristics and/or its application in the memory/storage hierarchy. For example, NVRAM 102 is different from:

static random access memory (SRAM) which may be used for level 0 and level 1 internal processor caches dedicated to each core within a processor and lower level cache (LLC) shared by cores within a processor;

dynamic random access memory (DRAM) configured as a cache internal to a processor die (e.g. on the same die as the processor), configured as one or more caches external to a processor die (e.g., in the same or a different package than the processor die), or general system memory external to the processor package; and FLASH memory/magnetic disk/optical disc applied as mass storage; and memory such as FLASH memory or other read only memory (ROM) applied as firmware memory (which can refer to boot ROM, BIOS Flash, and/or TPM Flash).

NVRAM 102 may be used as instruction and data storage that is directly addressable by a CPU 100 and is able to sufficiently keep pace with the CPU 100 in contrast to FLASH/magnetic disk/optical disc applied as mass storage. Direct addressability refers to a processor, such as a CPU or GPU, being able to send memory requests to the NVRAM as if it were standard DRAM (e.g., through standard memory store and load commands). Moreover, as discussed above and described in detail below, NVRAM 102 may be placed on a memory bus and may communicate directly with a memory controller that, in turn, communicates directly with the processor 100.

NVRAM 102 may be combined with other instruction and data storage technologies (e.g., DRAM) to form hybrid memories (also known as Co-locating PCM and DRAM; first level memory and second level memory; FLAM (FLASH and DRAM)). Note that at least some of the above technologies, including PCM/PCMS may be used for mass storage instead of, or in addition to, system memory, and need not be random accessible, byte addressable or directly addressable by the processor when applied in this manner.

For convenience of explanation, most of the remainder of the application will refer to "NVRAM" or, more specifically, "PCM," or "PCMS" as the technology selection for the non-volatile memory. As such, the terms NVRAM, PCM, and PCMS may be used interchangeably in the following discussion. However it should be realized, as discussed above, that different technologies may also be utilized.

1.B. Volatile Memory Overview

"Volatile memory" 100 is an intermediate level of memory configured in conjunction with NVRAM 102 that has lower read/write access latency relative to NVRAM 102 and/or more symmetric read/write access latency (i.e., having read times which are roughly equivalent to write times). In some embodiments, the volatile memory 100 has significantly lower write latency than the NVRAM 102 but similar (e.g., slightly lower or equal) read latency; for instance the volatile memory 100 may be a volatile memory such as volatile random access memory (VRAM) and may comprise a DRAM or other high speed capacitor-based memory. Note, however, that the underlying principles of the invention are not limited to these specific memory types. Additionally, the volatile memory 100 may have a relatively lower density and/or may be more expensive to manufacture than the NVRAM 102.

In some embodiments, volatile memory 100 is configured between the NVRAM 102 and the internal processor caches 120. In some of the embodiments described below, volatile memory 100 is utilized to mask the performance and/or usage limitations of the NVRAM 102 including, for example, read/write latency limitations and memory degradation limitations. In these implementations, the combination of volatile memory 100 and NVRAM 102 operates at a performance level which approximates, is equivalent or exceeds a system which uses only DRAM as system memory.

In different embodiments, volatile memory 100 can be located on the processor die, located external to the processor die on a separate die located on the CPU package, located outside the CPU package with a high bandwidth link to the CPU package, for example, on a memory dual in-line memory module (DIMM), a riser/mezzanine, or a computer motherboard). In FIG. 1, volatile memory 100 is shown being located external to the CPU 104 package. The volatile memory 100 may be communicatively coupled with the CPU 104 using a single or multiple high bandwidth links, such as DDR or other transactional high bandwidth links. A communicative coupling of devices refers to being coupled through an electrical, optical, wireless, or other form of link or combination of links to allow information to be passed back and forth between the devices that are coupled to one another. In some embodiments, the coupling is direct and allows information to pass directly from the first device to the second and, potentially, vice versa. In other embodiments, the coupling is indirect and requires the information to pass through one or more additional devices that reside along the route the information takes while being transferred between the two communicatively coupled devices in question.

1.C. GPU Overview

Today's integrated and discrete graphics adapters are limited by cost and power in the amount of volatile memory they utilize (e.g., Graphics DDR5 (GDDR5)). More memory allows graphical applications to run at higher display resolutions, to render scenes faster, and to provide higher visual quality (e.g. including higher texture detail, more samples per pixel on the screen, etc.).

According to several embodiments, the GPU 106 may be granted direct access to both volatile memory 100 and NVRAM 102. Supplementing the generally smaller available pool of volatile memory 100 space with the larger pool of NVRAM 102 space provides additional usage models for the graphics subsystem in a computer system that take advantage of the higher quantities, lower power, and lower cost of NVRAM 102.

GPU 106 may include one or more core(s) 108. Each core may include one or more execution units and one or more instruction and data caches utilized to feed the execution units with information to process. Additionally the GPU 106 may contain other graphics logic units that are not shown in FIG. 1, such as one or more vertex processing units, rasterization units, media processing units, and codecs among others. For sake of simplicity, the specific logic within the core(s) 108 as well as other graphics-related logic units within the GPU 106 are not shown. Each 108 core present is located on the GPU 106 semiconductor die. The GPU 106, in its entirety or in part, may be located on its own die, or collocated with other system components such as the CPU on a single die.

There may be one or more lower level caches in GPU 106 as well, such as cache 110. This cache may be utilized as a general purpose cache or a cache specific to one or more particular types of graphics data (e.g., vertex data). Other lower level caches are not shown, though in some embodiments multiple caches like cache 110 exist within GPU 106. One or more levels of the GPU 106 cache may or may not be shared with other system components such as the CPU 104.

In FIG. 1, the GPU 106 also includes a volatile memory controller 112, which may be utilized to provide access to volatile memory 100. For example, a GPU core may request access to a memory location in volatile memory space 100. The request is routed to volatile memory controller 112 and then the controller can send the request to volatile memory 100. In many embodiments, a portion of volatile memory 100 may be allocated specifically for GPU use, e.g., GPU volatile memory space 114. This allocated portion of volatile memory may exclusively be utilized by GPU 106. Another portion of volatile memory 100 may be allocated exclusively for CPU use, e.g., CPU volatile memory space 116. This separate allocation of different portions of volatile memory 100 for GPU 106 and CPU 104 may be locked into a pre-determined ratio of memory space for the GPU and CPU, or the allocation may be dynamically altered over the course of time so that the ratio of memory space for the GPU and CPU, separately, roughly correlates to the ratio of volatile memory 100 usage for the GPU and CPU.

GPU 106 also may include an NVRAM controller 118, to provide access to NVRAM 102. In different embodiments, the NVRAM controller 118 may be integrated into the volatile memory controller 112 or it may reside in a discrete location from the volatile memory controller 112 (the coupling of the volatile memory controller and NVRAM controller is shown as a dotted line to denote both options). In either event, when a GPU core requests access to a memory location, if the data is stored out in NVRAM 102 instead of in volatile memory 100, NVRAM controller 118 is capable of sending a request directly to NVRAM 102 to read or write data. In many embodiments, a portion of NVRAM 102 may be allocated specifically for GPU use, e.g., GPU NVRAM memory space 120. Another portion of NVRAM 102 may be allocated specifically for CPU use, e.g., CPU NVRAM memory space 122. Similar to the separate allocations of volatile memory space described above, the different portions of NVRAM memory space may be locked into a pre-determined ratio of memory space for the GPU and CPU or the allocation may be dynamically altered based on usage over time.

In many embodiments, a portion of volatile memory 100 is allocated as a shared volatile memory space 148, which accepts access from both the CPU 104 and the GPU 106. Additionally, a portion of non-volatile memory 102 is allocated as a shared non-volatile memory space 150, which also accepts access from both the CPU 104 and GPU 106. Although not shown, shared memory space may utilize semaphores, mutexs, or other shared memory space management techniques.

According to many embodiments, a display controller 124 is communicatively coupled to the GPU. The display controller 124 receives information to be displayed upon a display device (e.g., a monitor, a television, a projector, etc.). In many embodiments, the display controller 124 specifically receives frame buffers. Each frame buffer consists of an image comprising pixels that is then interpreted by the display controller and the image is fed to the display device for viewing. Depending on the refresh frequency of the display device, frame buffers may be fed to the display controller 124 a certain number of times per second. For example, a 60 Hz refresh rate utilizes 60 images (frame buffers of image information) per second. Different display devices may utilize higher frequency refresh rates and simply re-sample the same frame buffer two or more times prior to utilizing a new frame buffer of information to display.

1.D. CPU and I/O Subsystem Overview

As shown in the embodiment of the system illustrated in FIG. 1, a CPU 104 is present. This CPU includes one or more cores 126. Although not shown, each core may internally include one or more instruction/data caches, execution units, prefetch buffers, instruction queues, branch address calculation units, instruction decoders, floating point units, retirement units, etc. Each core present is located on the CPU 104 semiconductor die. For each logic unit shown other than the core(s) 126 in the CPU 104 box, such as cache 128, the logic unit may be on the CPU 104 semiconductor die in some embodiments or on another die in other embodiments. Additionally, if a given logic unit is not on the same die as CPU 104, that logic unit may be included in the same semiconductor package, which can include several dies communicatively coupled with each other in the package.

The CPU 104 also includes at least one lower level cache, such as cache 128. This may be a general purpose cache that is capable of storing a significant amount of data retrieved from memory locations in volatile memory 100 and/or NVRAM 102. In different embodiments, cache 128 may be shared among all cores or each core may have its own lower level cache.

CPU 104 may also include a home agent 130 that incorporates components coordinating and operating core(s) 126. Home agent unit 130 may include, for example, a power control unit (PCU). The PCU may include logic and components needed for regulating the power state of the core(s) among other tasks.

In FIG. 1, the CPU 104 also includes a volatile memory controller 132, which may be utilized to provide access to volatile memory 100. Similar to volatile memory controller 112 integrated into GPU 106, volatile memory controller 132, which is integrated into CPU 104, may receive a memory access request from a CPU core and route that request to volatile memory 100. Likewise, NVRAM controller 134 may receive a memory access request from a CPU core and route that request to NVRAM 102.

In many embodiments, an input/output (I/O) subsystem is present in the system in FIG. 1 to communicate with I/O devices, such as I/O device(s) 138. The I/O subsystem 136 in FIG. 1 is integrated into the CPU 104 package. Within the I/O subsystem 136, one or more I/O adapter(s) 140 are present to translate a host communication protocol utilized within the CPU 104 to a protocol compatible with particular I/O devices. Some of the protocols that adapters may be utilized for translation include Peripheral Component Interconnect (PCI)-Express (PCI-E), 3.0; Universal Serial Bus (USB), 3.0; Serial Advanced Technology Attachment (SATA), 3.0; Small Computer System Interface (SCSI). Ultra-640; and Institute of Electrical and Electronics Engineers (IEEE) 1394 "Firewire;" among others.

Additionally, there may be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols: and cellular protocols A Basic Input/Output System (BIOS) flash 142 device may additionally be present in the system to provide a set of boot instructions when the system powers on or reboots. For BIOS flash 142 device, some of the protocols that I/O adapters 140 may translate include Serial Peripheral Interface (SPI), Microwire, among others.

1.E. Memory Augmentation Logic

In many embodiments, both the GPU 106 and CPU 104 contain memory augmentation (MA) logic capable of providing memory management that takes advantage of a combined utilization of both volatile memory and NVRAM for graphics applications. Specifically, GPU MA logic 144 is integrated into the GPU 106 package and is capable of managing global GPU memory space that includes directly addressable GPU volatile memory space 114 as well as directly addressable GPU NVRAM memory space 120.

In many embodiments, the CPU 104 also has MA logic, specifically CPU MA logic 146, that is integrated in the CPU 104 package and is capable of managing global CPU memory space that includes directly addressable CPU volatile memory space 116 as well as directly addressable CPU NVRAM memory space 122. In many embodiments, CPU MA logic 146 may include software logic, hardware logic (as shown), firmware logic, or a combination of any of the above types of logic.

Figure 2:
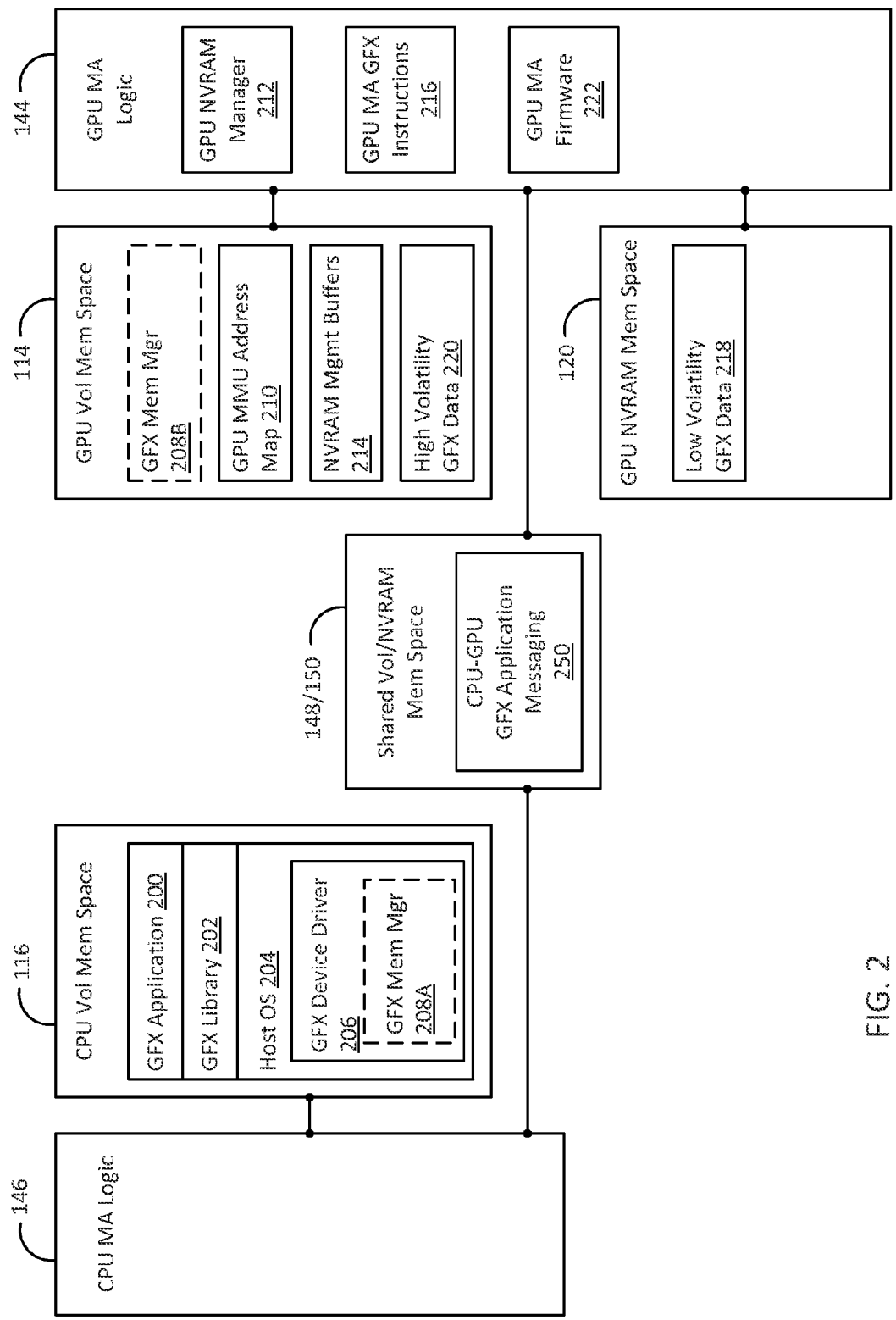
FIG. 2 illustrates logic elements utilized in both hardware and software to manage a computer system in which the GPU is capable of accessing both volatile memory and NVRAM through direct addressing.

FIG. 2 illustrates logic elements utilized in both hardware and software to manage a computer system in which the GPU is capable of accessing both volatile memory 100 and NVRAM 102 through direct addressing. FIG. 2 shows GPU and CPU MA logic (144 and 146, respectively), GPU volatile memory space 114, CPU volatile memory space 116, shared volatile memory space 148, shared NVRAM memory space 150, and GPU NVRAM memory space 120, which were all introduced in FIG. 1.

Because the implementation of graphics-based NVRAM usage involves both the CPU as well as the GPU, in many embodiments, a CPU-GPU graphics (GFX) application messaging system 250 is utilized to provide a simple communication between the CPU and GPU. This communication takes place through either shared volatile memory space 148 locations, shared NVRAM memory space 150 locations, or both. The CPU-GPU messaging system will be described in greater detail further below.

A graphics-based software application, such as graphics (GFX) application 200, is running on the computer system (in CPU volatile memory space 116) partially illustrated in FIG. 2 (more completely illustrated in FIG. 1). The GFX application 200 takes advantage of a GFX library (e.g., OpenGL) to call specific functions to help render images to the display. The GFX library 202 typically runs within a host OS 204 (e.g., Microsoft® Windows®). The host OS has a compatible GFX device driver 206 installed that communicates with the graphics subsystem by making specific hardware system calls that cause the graphics subsystem to perform work to ultimately display the image. In some embodiments, a GFX memory manager 208A, running on the host CPU, is utilized by the GFX device driver 206 to discern where in global memory space a given piece of graphics data (e.g. a texture, a vertex, etc.) resides. The GFX memory manager is capable of copying data to or from either volatile memory or NVRAM based on the address of the data. In alternative embodiments, the GFX memory manager 208B runs directly on the GPU and resides in GPU volatile memory space 114. The GFX memory manager, capable of being run on either the host CPU side or directly on the GPU, will now be referred to as GFX memory manager 208A/B to illustrate both options.

According to many embodiments, the GFX memory manager 208A/B maintains a GPU memory management unit (MMU) address map 210, which maps addresses for graphics data physical memory storage locations. The GPU MMU address map 210 may be implemented in multiple ways depending on how the NVRAM addressing scheme works. In a directly addressable scheme, the address map provides a physical memory address for each piece of graphics data, whether that data resides in NVRAM or elsewhere. For example, with directly addressable NVRAM, physical memory address space may include an amount of address space at the bottom of memory equal to the amount of volatile memory. In other words, 1 gigabyte (GB) of volatile memory would include the bottom 1 GB of physical memory addresses correlating to volatile memory space. Then on top of the 1 GB of volatile memory, 64 GB of NVRAM is also present. Therefore, physical address space between 1 GB and 65 GB-1 would correlate to NVRAM memory space. We utilize this simplistic example of graphics memory space address ranges for ease of explanation. In other usage models the CPU's volatile memory and NVRAM address ranges may take up many gigabytes of addresses at the bottom of addressable memory and graphics memory address space (volatile and NVRAM) may reside above that.

Outside of a directly addressable scheme, there are many indirect address schemes available. In any indirect scheme, where NVRAM is not directly addressable memory, a translation may take place. For example, if NVRAM is accessed through a file system, the GFX memory manager 208A/B may utilize the GPU MMU address map to act as an indirection table that maps 1 GB to 65 GB-1 in addresses to storage locations in the NVRAM file system.

Other indirection schemes may be alternatively utilized. For example, NVRAM may be directly addressable, but the uneven wearing of NVRAM locations may cause a wear leveling algorithm to be utilized. Thus, the 1 GB to 65 GB-1 portion of addressable memory space that correlates to NVRAM locations may actually be indirect logical addresses.

A GPU NVRAM manager 212 may be implemented in GPU MA logic 144 to perform tasks such as wear leveling. Therefore, GPU MMU address map 210 may include an indirection table that maps each NVRAM logical address to a NVRAM physical address. When the GPU is idle or in a low work state, GPU NVRAM manager 212 may wear level the NVRAM for maintenance and, as a result, cause an update to one or more NVRAM logical addresses relating to NVRAM physical addresses. Other than maintaining indirection tables in the GPU MMU address map 210 and performing wear leveling, the GPU NVRAM manager 212 may also perform garbage collection in the NVRAM as well as other maintenance tasks. In many embodiments, these maintenance tasks require one or more NVRAM management buffers 214 to temporarily store data that may be moved from one NVRAM physical memory location to another. The GPU NVRAM manager may be implemented in firmware or as an application-specific integrated circuit (ASIC) in GPU MA logic 144 according to several embodiments.

In many embodiments, the GPU may implement new instructions to move data between GPU volatile memory space 114 and GPU NVRAM memory space 120. These instructions may be supplied by the GFX device driver 206 or the GFX memory manager 208A/B to be executed as part of the GPU's instruction stream. The microcode storing the details of the operations to perform the instructions may be stored in GPU MA logic 144 (e.g., GPU MA GFX instructions 216).

Additionally, GPU MA firmware 222 may store logic to map graphics data into addressable locations in NVRAM.

According to many embodiments, GPU MA logic 144 and GFX memory manager 208A/B are capable of managing the physical storage locations of logical addresses in a manner that is transparent to the GPU. For example, the GPU may initiate a memory request for a logical address and the GPU MA logic 144 and GFX memory manager 208A/B can then perform a page walk to determine the physical location of the logical address without the knowledge of the GPU. The GPU simply is requesting data and as long as the latency is adequate, there is no need for the GPU to have a cause to know of the physical location of the stored data.

Graphics resource data such as textures, geometry, shaders, render target data, compiled shader data, z buffers, index buffers, and media buffers need to be stored in GPU accessible memory locations in volatile and NVRAM memories. The volatility of graphics-related data (i.e., volatile refers to the frequency of change to the data itself) varies based on the type of data. For example, texture data generally does not change over the lifetime of the graphics application so it has extremely low volatility. On the other hand, other graphics-related data changes at a much faster rate. Low volatility data is a very good candidate to be stored in NVRAM space because the data is written with less frequency (possibly only once) and write latency for that type of data would not be considered a bottleneck to graphics application performance.

Figure 3:
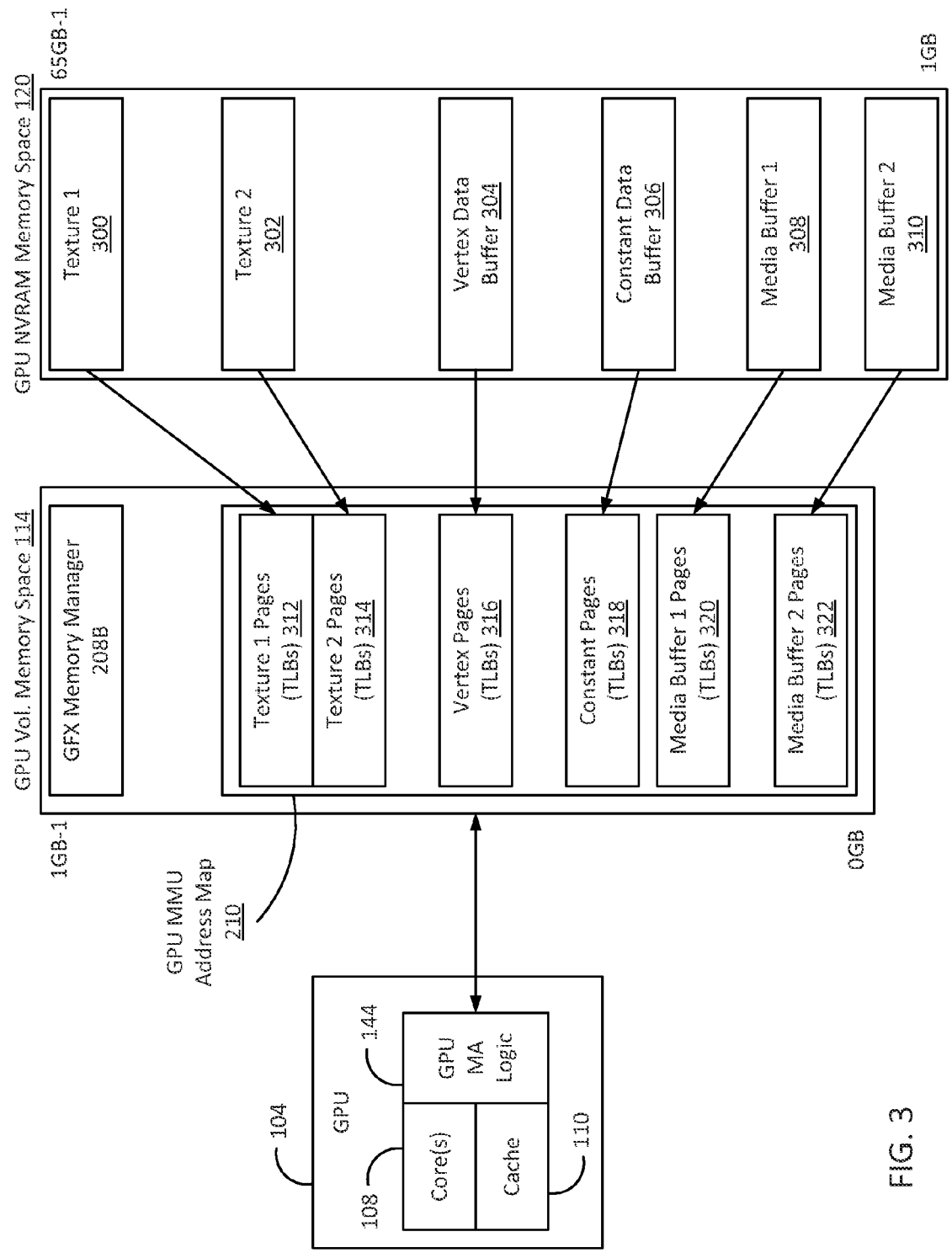
FIG. 3 illustrates a more detailed description of the data stored in NVRAM and in volatile memory as part of the GPU MMU address map.

Thus, GPU NVRAM memory space 120 would generally store low volatility GFX data 216 while GPU volatile memory space 114 would store high volatility GFX data 218. FIG. 3 illustrates a more detailed description of the data stored in NVRAM and in volatile memory as part of the GPU MMU address map.

As shown in FIG. 3, there are many pieces of graphics data stored in the GPU NVRAM memory space 120 (0 GB to 1 GB-1). Specifically, texture 1 (300), texture 2 (302), vertex data buffer 304, constant data buffer 306, media buffer 1 (308), and media buffer 2 (310) are shown as stored in GPU NVRAM memory space 120 (1 GB to 65 GB-1). The locations of these pieces of graphics data are mapped directly into the GPU MMU address map 210 in GPU volatile memory space 114. In many embodiments, the process of mapping the location includes the GFX memory manager 208A/B translating the addresses within NVRAM and providing the address map translation as a translation lookaside buffer (TLB) entry that is stored in the GPU MMU address map 210 (e.g., texture 1 TLB entry 312, texture 2 TLB entry 314, vertex data buffer TLB entry 316, constant pages TLB entry 318, media buffer 1 TLB entry 320, and media buffer 2 TLB entry 322). This same technique can be applied to any other form of graphics resource data as well.

The result allows the GPU to quickly look up the physical address of the graphics data needed and then send a memory request directly to the GPU NVRAM to retrieve or write the data. In FIG. 3, the GPU MMU address map 210 is expanded to show individual entries for sake of explanation. The footprint of the items within GPU volatile memory space 114 and GPU NVRAM memory space 120 is not to scale.

Figure 4:
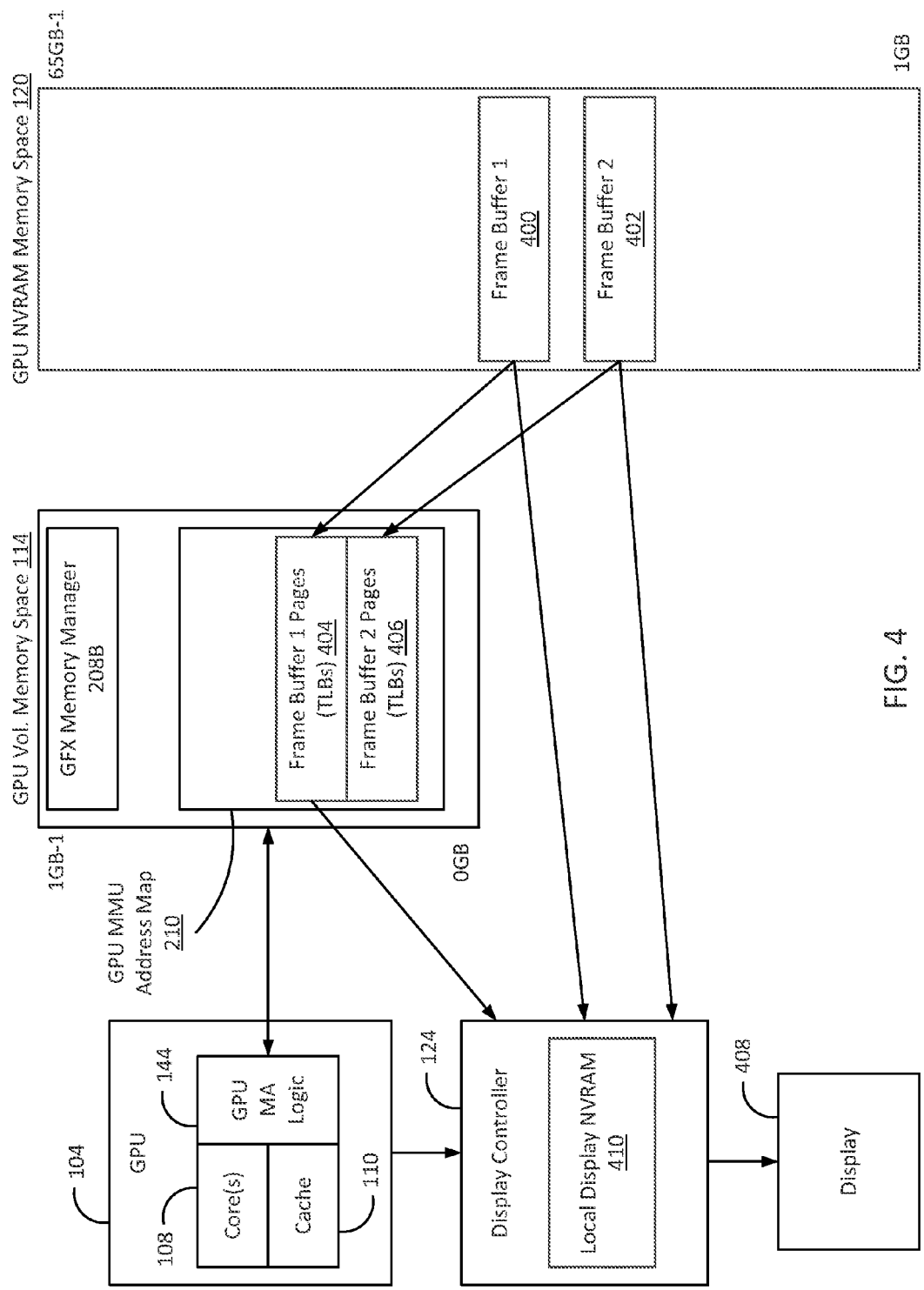
FIG. 4 illustrates a mechanism providing large and addressable storage for frame buffers.

FIG. 4 illustrates a mechanism providing large and addressable storage for frame buffers. Frame buffers are updated in the frame boundary, which would be 16 ms per displayed frame for a 60 Hz refresh rate. Generally speaking, there is low write traffic for a frame buffer since it is only updated at most the frequency of the refresh rate. But the frame buffer can become a large footprint in memory with high resolution images and, potentially, 3D stereoscopic images. Thus, to save on memory cost, in many embodiments, the frame buffer may use NVRAM as its storage location, which can free up additional expensive GDDR5 or other types of graphics memory for other usages.

According to many embodiments, there may be multiple frame buffers stored in NVRAM, such as frame buffer 1 (400) and frame buffer 2 (402). The GPU MA firmware within GPU MA logic 144 maps the frame buffer data created by the GPU into an addressable range in GPU NVRAM memory space 120. The GFX memory manager 208A/B then maps the NVRAM addresses that the frame buffers are stored at into the GPU MMU address map 210, at frame buffer 1 TLB entry 404 and frame buffer 2 TLB entry 406, respectively.

Once the frame buffers have had their addresses calculated and the TLB entries are stored in the GPU volatile memory space 114, the display controller 124 can then pull the TLB translated physical addresses of the frame buffers from the GPU MMU address map 210. With the correct GPU NVRAM memory space 120 addresses, the display controller can then scan the image data from the direct NVRAM locations where the frame buffers are stored without the need for a copy into volatile memory. Once the display controller 124 has scanned a frame buffer, it can then display it on display 408.

In some embodiments, the display controller utilized panel self refresh display controller technology, which allows a static image to stay on the screen for multiple frame buffer refreshes without updating the frame buffer (e.g., when someone is reading a full page document). In these instances, frame buffer 1 (400) and frame buffer 2 (402) may not be updated as frequently as the refresh frequency. Also, in many panel self refresh display controller embodiments, a local display NVRAM 410 may reside in the display controller. In many cases, the current frame buffer may be stored for some time while the screen does not update and this will allow for the display to remain unchanging from a local memory store in the display controller.

Furthermore, when a computer system is powered down, the local display NVRAM 410, being a non-volatile memory, can maintain the contents of the frame buffer even with no power being supplied to the display controller 124. Thus, when the display controller receives power again, the local display NVRAM 410 may continue to store the most recent frame buffer(s) received from GPU NVRAM memory space 120. This will allow for an even faster power on to display time delta than otherwise would be possible.

Figure 5:
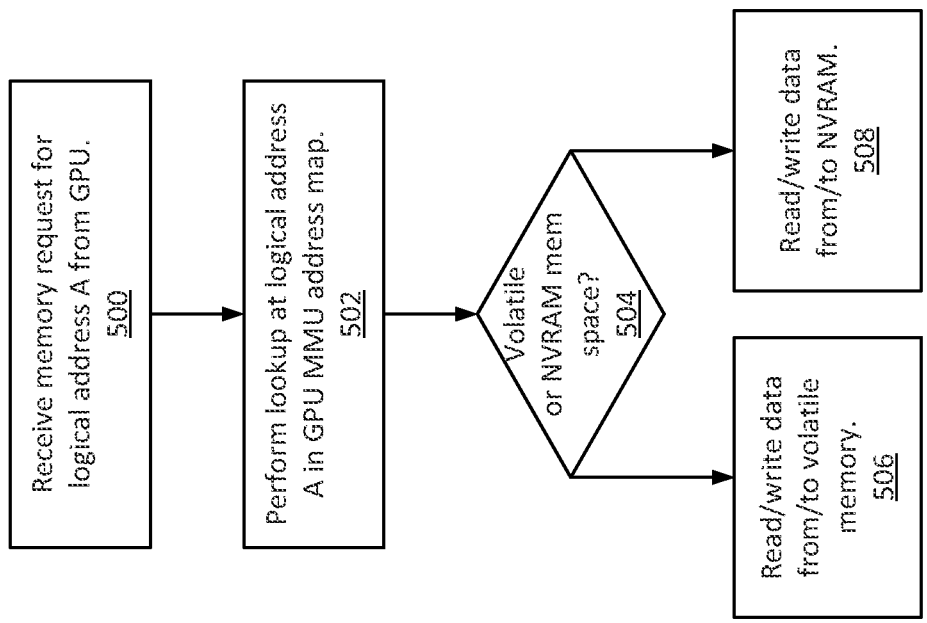
FIG. 5 describes a flow diagram of a process to utilize a memory-augmentation scheme to supplement standard volatile memory in a computer device running a graphics application with directly addressable NVRAM.

FIG. 5 describes a flow diagram of a process to utilize a memory-augmentation scheme to supplement standard volatile memory in a computer device running a graphics application with directly addressable NVRAM.

The process is performed by processing logic which may be comprised of software, hardware, firmware, or a combination of two or more of these types of processing logic. The process starts with processing logic receiving a memory request, from the GPU, for logical address A (processing block 500). Next, processing logic performs a lookup at logical address A in the GPU MMU address map (processing block 502). In some embodiments, the GPU MMU address map may be stored within GPU-addressable volatile memory. In other embodiments, the GPU MMU address map may be stored within a cache accessible by the GPU.

The lookup includes a page walk to get from a logical address to the physical address where the data is actually stored. For example, 65 GB of logical address space may comprise 1 GB of addressable volatile memory and 64 GB of NVRAM. In other embodiments other combinations of volatile memory and NVRAM sizes are utilized. In some embodiments, the GPU-addressable volatile memory is shared volatile memory that is also utilized by one or more CPUs. In other embodiments, the volatile memory is exclusive to the GPU, such as GDDR5 memory.

Once the physical address has been looked up from the page walk, processing logic then determines whether the physical address found is in volatile memory space or NVRAM memory space (processing block 504). If the result is volatile memory space, then processing logic performs the requested read from volatile memory or write to volatile memory at the memory location (processing block 506). Alternatively, if the result is NVRAM space, then processing logic performs the requested read from NVRAM or write to NVRAM at the memory location (processing block 508).

In many embodiments, the CPU is capable of tagging related graphics elements/resources to indicate whether a given element/resource is to be stored in volatile memory or NVRAM. Software running on the CPU core may instruct the GPU or GPU memory controller through a command designed to set a tag of a resource.

Figure 6:
FIG. 6 describes a flow diagram of a process to utilize a tagging mechanism to determine a location to store a graphics related resource.

FIG. 6 describes a flow diagram of a process to utilize a tagging mechanism to determine a location to store a graphics related resource.

The process is performed by processing logic which may be comprised of software, hardware, firmware, or a combination of two or more of these types of processing logic. The process begins with processing logic sending static/near-static tag for graphics data resource at address A to GFX memory manager (processing block 600). The static/near-static tag refers to a stored or to-be stored resource that will not change or will change relatively few times over the course of the lifetime of the application utilizing the resource. A texture in a 3D application is an example of a resource that is set and generally will not change over the course of the time the 3D application is running. Thus, software running on the CPU may have a command to tag such resources to label them as being static (non-changing) resources or near-static (not frequently changing) resources.

Once the tag has been sent to the GFX memory manager, then processing logic populates the related tag field at address A in the GPU MMU address map (processing block 602). Once the resource is labeled with the tag in the GPU MMU address map, the GFX memory manager can then either immediately move the resource from volatile memory to NVRAM based on the tag, move the resource the next time the resource is utilized, or move the resource in another manner. The specific action taken is up to the logic of the GFX memory manager, but the tag labeling the resource as static or near-static informs the GFX memory manager of the nature of the resource. In an alternate embodiment, tagged resources can be placed directly into the NVRAM, bypassing volatile memory entirely.

In some embodiments, the 3D application is initially loaded with tags embedded for all of its resources as to nature of the resource (static/near-static or not) and the CPU, GFX memory manager, or other logic in the system can perform the initial load of the resources using that knowledge. In other embodiments, the tag can be placed on a resource during run-time. For example, a software application in the CPU may track a given resource's accesses and modify the tag accordingly if the accesses do not reflect the current state of the tag for the resource.

Figure 7:
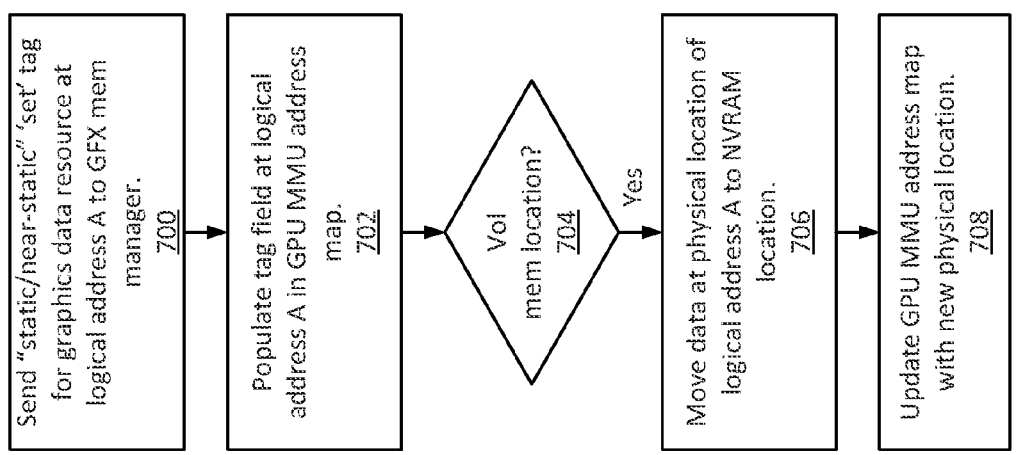
FIG. 7 describes a flow diagram of a process to utilize a tagging mechanism to determine a location to store a graphics related resource.

FIG. 7 describes a flow diagram of a process to utilize a tagging mechanism to determine a location to store a graphics related resource.

The process is performed by processing logic which may be comprised of software, hardware, firmware, or a combination of two or more of these types of processing logic. The process begins with processing logic sending static/near-static 'set' tag for graphics data resource at address A to GFX memory manager (processing block 600). In the embodiment shown in FIG. 7, the 3D application is operational and therefore the graphics data resource has already been stored in a given location. The static/near-static tag can be set or cleared according to many embodiments, which means that when 'set' the resource would be indicated as a static/near-static resource and when 'cleared' the resource would be indicated as a non-static/non-near-static resource. In other embodiments that are not shown, the static/near-static tag can incorporate more than one bit, which would allow setting multiple relative levels of static/near-static tendencies for a resource. For example, if the tag was 2-bits, there may be 4 levels ranging from a static to a non-static tendency of the resource.

Additionally, in the embodiment shown in FIG. 7, the tag is being 'set', thus the processing logic is indicating the resource is static or near-static in nature. Once the tag has been sent to the GFX memory manager, then processing logic populates the related tag field at address A in the GPU MMU address map (processing block 702).

Next, processing logic, after populating the tag field, determines whether the current given location that the graphics data resource is in volatile memory (processing block 704). If so, and because processing logic had indicated the resource was a static or near-static resource by setting the tag in block 700, processing logic then moves the data at the physical location of logical address A to an NVRAM storage location (processing block 706). Finally, processing logic updates the GPU MMU address map with the new physical location for logical address A (processing block 708).

In many embodiments, although not specifically shown in FIG. 7, the reverse of this process may also happen. In other words, processing logic may 'clear' the static/near-static bit and if the current physical location of the resource is in NVRAM, the resource may then be subsequently moved to volatile memory.

According to some embodiments, a resource may begin its life during runtime of a 3D application as not static (e.g., frequently changing) and, for one reason or another, change at some point during the lifespan of the 3D application change to a static resource, and vice versa. Additionally, in these embodiments, the management of these resources may allow for changing a static/near-static tag from set to clear or from clear to set and then delaying the movement of the resource itself until the resource in next accessed.

Figure 8:
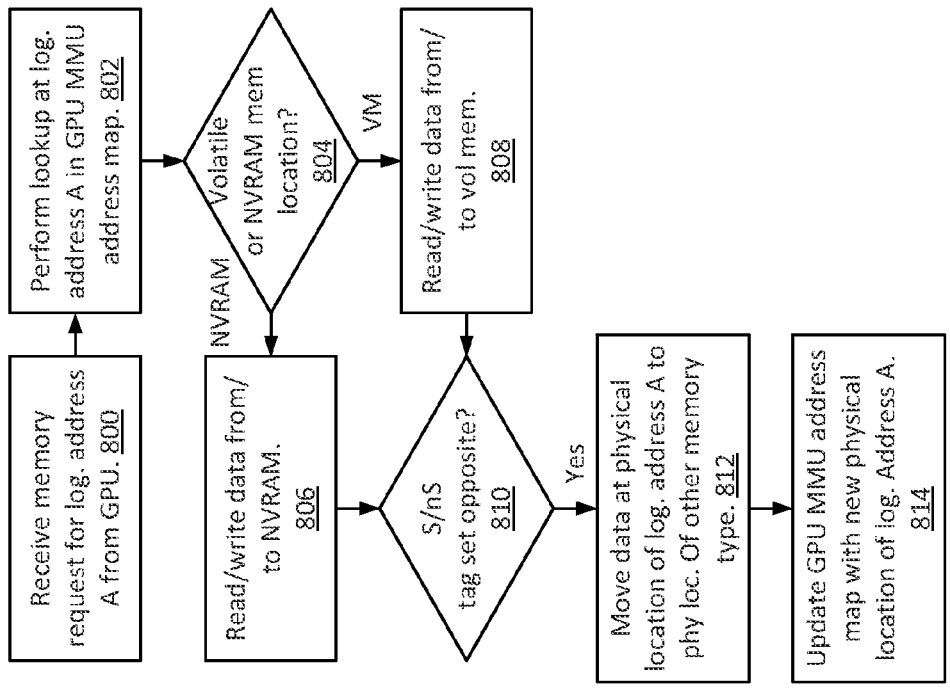
FIG. 8 describes a flow diagram of a process to utilize a memory-augmentation scheme to supplement standard volatile memory in a computer device with directly addressable NVRAM while implementing a tagging mechanism to determine a location to store a graphics related resource.

FIG. 8 describes a flow diagram of a process to utilize a memory-augmentation scheme to supplement standard volatile memory in a computer device with directly addressable NVRAM while implementing a tagging mechanism to determine a location to store a graphics related resource.

The process is performed by processing logic which may be comprised of software, hardware, firmware, or a combination of two or more of these types of processing logic. The process starts with processing logic receiving a memory request, from the GPU, for logical address A (processing block 800). Next, processing logic performs a lookup at logical address A in the GPU MMU address map (processing block 802.

Once the physical address has been looked up from the page walk, processing logic then determines whether the physical address found is in volatile memory space or NVRAM memory space (processing block 804). If the result is NVRAM space, then processing logic performs the requested read from NVRAM or write to NVRAM at the memory location (processing block 806). Alternatively, if the result is volatile memory space, then processing logic performs the requested read from volatile memory or write to volatile memory at the memory location (processing block 808).

Next, processing logic checks to see if the static/near-static tag is set to the opposite memory type from the memory type where the resource is currently located (processing block 810). In other words, in this embodiment, processing logic at an earlier time may have changed the tag but is waiting for the next memory operation to that address location before the actual data is moved to the other form of memory (NVRAM to volatile memory or volatile memory to NVRAM).

If the tag is the same, nothing is done. But if the tag is set to indicate the resource should be stored in the opposite memory type, the processing logic moves the data at the physical location of the logical address A to a physical location in the other memory type (processing block 812). Finally, processing logic updates the GPU MMU address map with the new physical location of logical address A (processing block 814).

Additionally, although not shown, an additional tag bit (e.g., change bit) may be utilized to indicate that processing logic has recently changed the static/near-static bit value for a given resource. During a relative idle time for the 3D application when the memory controller is not overly taxed, an NVRAM management scheme may systematically go through the GPU MMU address map that contains the address tables and the associated tags per resource at the addresses, check for the change bit per address, and move those that indicate a recent change from NVRAM to volatile memory or vice versa. Once the movement has taken place, the change bit can be cleared.

1.F. Instant on Graphics Applications

According to many embodiments, the computer system described in FIG. 1 through FIG. 4 can be utilized to implement graphics applications with the appearance of being "instantly on" from a low power state of the computer. "Instant on" refers to the perception by a human being that there is virtually no delay (e.g. less than 1 second) from the time the person turns the computing device on from the low power state ('off', 'sleep', 'hibernate') to the time where the computing device is resuming work on a graphics-based application (such as playing a 3D game or watching a movie).

Figure 9:
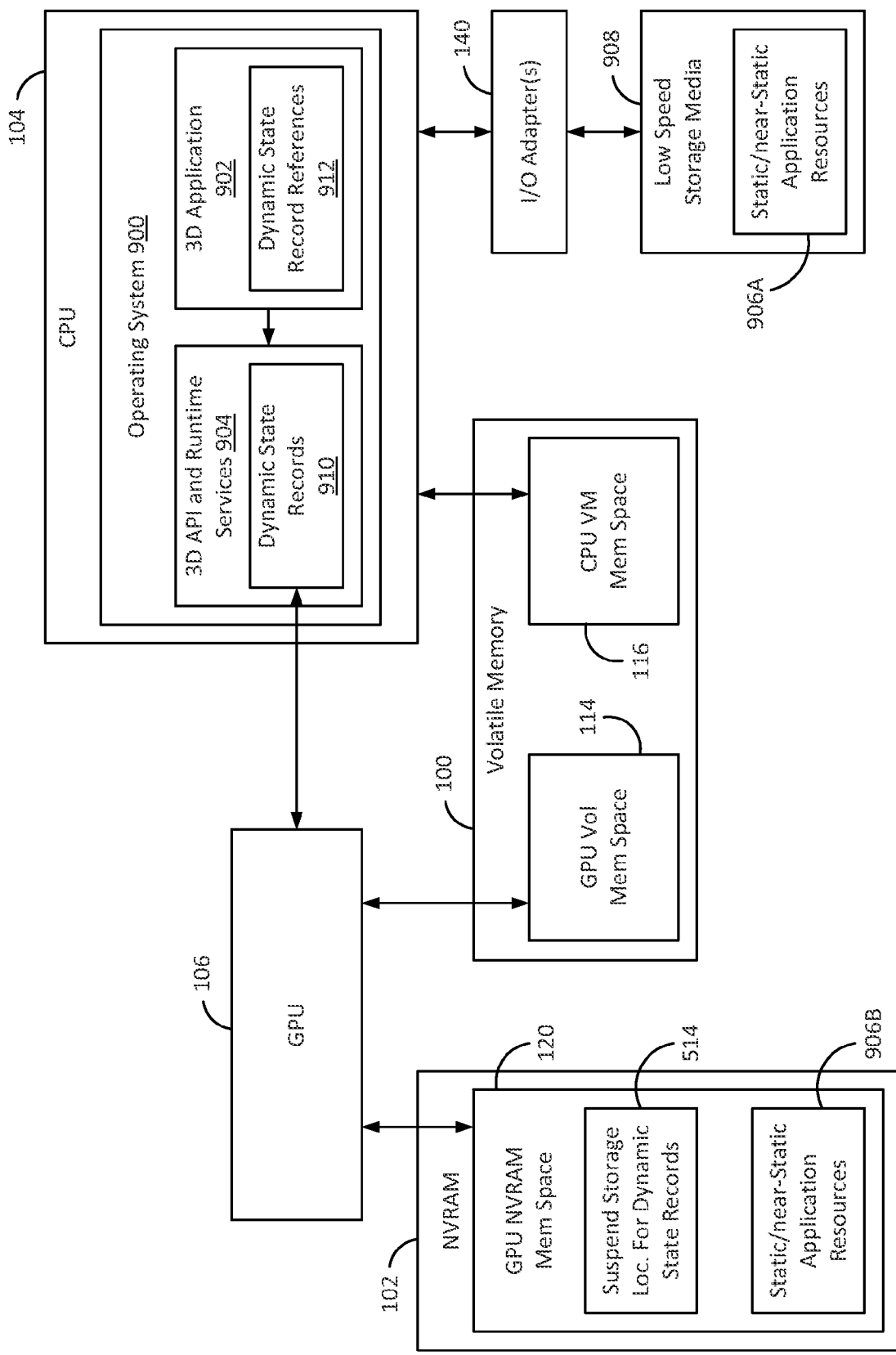
FIG. 9 describes a basic system architecture for utilizing a memory augmented computing device to resume operational work on a graphical application from a low power state in a short period of time.

FIG. 9 describes a basic system architecture for utilizing a memory augmented computing device to resume operational work on a graphical application from a low power state in a short period of time. Current computing devices require the loading of 3D application resources such as textures from a hard disk drive or SSD drive into CPU memory space and then moving those resources into GPU addressable memory. By utilizing the computing device described in FIG. 1, the loading and copying of these resources can be eliminated, thereby shortening the time required to go from device standby into a 'graphics application running' state.

As stated, current computing devices write all dynamic state information to non-volatile storage media before suspending operation to a low power state. When the computing device resumes work, all of the dynamic state information must be read back from the storage media. For example, for a 3D application all the resources needed by the application must be recreated in CPU addressable non-volatile memory, and then made available to the GPU in GPU addressable volatile memory.

Instead of these multiple copy steps upon resume, the computing device in FIG. 9 ensures all of the 3D application's resources exist in GPU addressable non-volatile memory at suspend time. By ensuring that these resources are located in GPU addressable high-speed non-volatile memory at suspend time, they are available at resume time very quickly, which allows the application to resume operation immediately. Resources do not have to be recreated in CPU and GPU addressable memory.

In many embodiments, the CPU 104, during normal runtime of the computing device (i.e., runtime refers to a powered operational CPU state that can capably execute OS and application code), executes code for an operating system 900. In FIG. 9, the OS 900 is shown as being within the CPU 104 for illustrative purposes to show that the OS 900 is actually running and, therefore, OS code may populate portions of an instruction cache, a data cache, and/or a lower level cache that resides within the CPU 104. These CPU package hardware elements are discussed in greater detail above in regard to FIG. 1.

During runtime, a 3D application 902 may be loaded to execute 3D graphics code for rendering 3D scenes to the computing device's display. Generally, the 3D application 902 will utilize 3D API/runtime services logic 904 to provide the application access to standard 3D functions that can be interpreted as commands by the GPU 106. For example, a version of OpenGL may be utilized as a 3D API to provide these standard 3D instructions.

To facilitate an "instant on" capability for a 3D application 902, static and semi-static application resources 906A (those that do not change over the course of the application's life such as textures or those that change infrequently in comparison to the execution speed of the GPU and CPU, such as resources that may change once a second or 10 times a second, as opposed to resources that may change once or more every micro-second) are placed in NVRAM 102 (resulting in static application resources 906B) at the time the 3D application 902 is originally launched (i.e., started). For example, the resources may be copied from a low-speed storage media 908 (e.g., a hard disk drive, an optical drive, etc.). In some embodiments, the low-speed storage media 908 may store static application resources 906A when the 3D application 902 is not running. Once the 3D application has been selected to run, there is an initial transfer of the static application resources from location 906A to location 906B. As the 3D application 902 runs it utilizes the 3D API/runtime services logic 904 to provide a communication channel to GPU 106 functions.

Once the 3D application 902 is running, the 3D API/runtime services logic 904 maintains dynamic state records 910. The dynamic state records 910 for the 3D application 902 are state information may that change frequently through the execution lifespan of the 3D application 902. Thus, while these records are being utilized by the 3D application 902, they are likely kept within CPU volatile memory space 116 and brought (and potentially kept) in one or more caches within the CPU package during runtime. Specifically, the 3D application 902 keeps dynamic state record references 912 which point to the actual dynamic state records 910, which can be modified by the CPU 102 during execution and fed to the GPU 106. Additionally, during operation the static and semi-static application resources may be directly read from location 906B in NVRAM 102.

When a suspend/sleep/hibernate operation is initiated in the computing device, all the dynamic state records 910 for resources that are maintained by the CPU 104 in CPU-addressable volatile memory space 116 are copied to NVRAM 102 at suspend storage location 914. On resume, these dynamic state records are restored from NVRAM suspend storage location 914 and copied back into CPU volatile memory space 116 to restore dynamic state records 910. The humanly-perceived lack of wait time from suspend to resume at least partially stems from a standard memory copy from high-speed NVRAM 102 to high-speed volatile memory 100. By completing the save and restore operation as described, the 3D application 902 is not required to recreate all the dynamic state records as is otherwise generally done.

At this point, the 3D application 902 can resume operation referencing all resources that were in use prior to the suspend/sleep/hibernate operation. All resources are already present in GPU-addressable NVRAM memory space and they can be referenced by the 3D application 902 for rendering operations.

Figure 10:
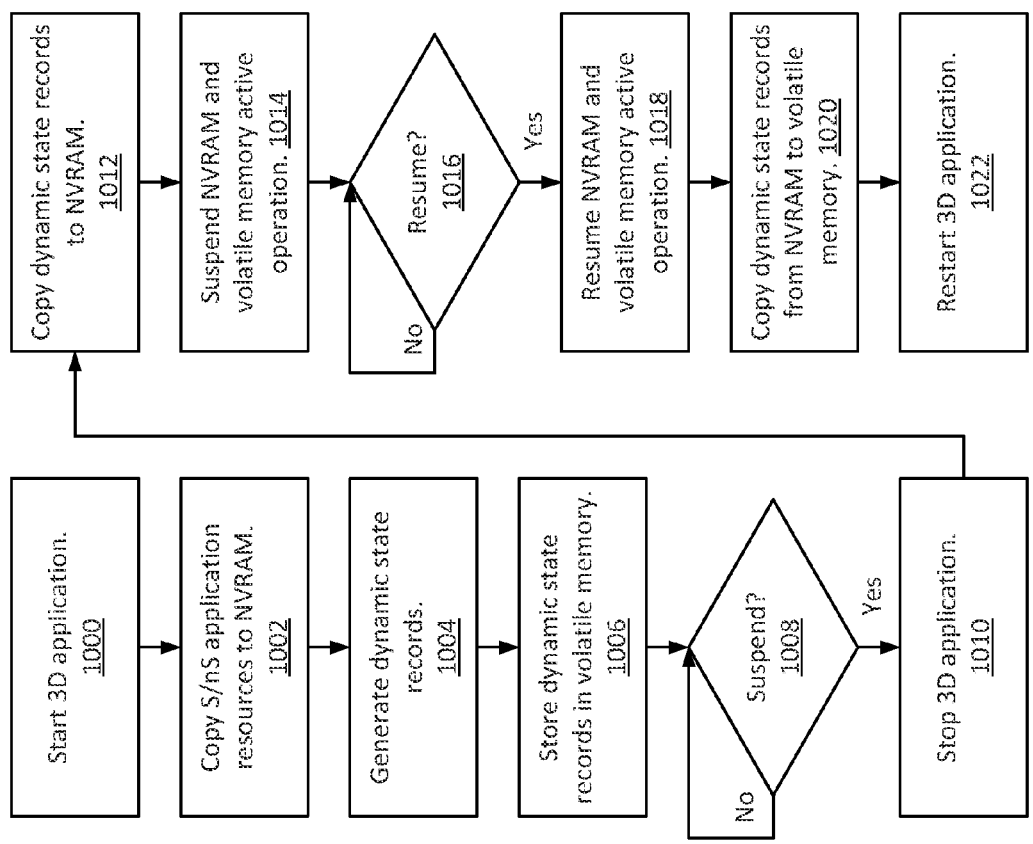
FIG. 10 describes a flow diagram of a process to utilize a memory-augmentation scheme to supplement standard volatile memory in a computer device with directly addressable NVRAM during the launch and normal operation of a 3D application running on the computer device.

FIG. 10 describes a flow diagram of a process to utilize a memory-augmentation scheme to supplement standard volatile memory in a computer device with directly addressable NVRAM during the launch and normal operation of a 3D application running on the computer device.

The process is performed by processing logic which may be comprised of software, hardware, firmware, or a combination of two or more of these types of processing logic. The process starts with processing logic starting a 3D application (processing block 1000). For example, the 3D application may be a game where a user moves a character around in a 3D environment. Upon starting the 3D application, processing logic copies static/near-static application resources to NVRAM in the system (processing block 1002). This copy may be predetermined based on the 3D application indicating what resources are static/near-static or this copy may be determined by a graphics API interface that sorts resources loaded from the 3D application into different groups by the change activity the resources are likely to be subjected to.

Then, still as the 3D application is initially loading immediately after start, processing logic generates any dynamic state records that are necessary (processing block 1004). These dynamic state records 1004 relate to resources that are dynamic and will change frequently over the course of the lifespan of the 3D application. Thus, processing logic then stores the generated dynamic state records in volatile memory (processing block 1006). In many embodiments, the dynamic state records may remain in a GPU cache during operation of the 3D application, depending on the frequency of change to a given record.

At this point the 3D application may be executing and operating normally for a given length of time. During normal operation, processing logic is ready for a suspend indication from the GPU or from the computing device in general. This suspend may include suspending into a standby mode, a hibernation mode, or another low power mode (e.g., the 3D application is being run on a laptop and the user shuts the laptop's lid, or the 3D application is being run on a smartphone and the user pushes the display off button). Thus, processing logic waits for the suspend command (processing block 1008).

Once the suspend command is issued, processing logic stops the 3D application (processing block 1010). Stopping the 3D application simply refers to restraining further execution, which includes having each of the dynamic state records not changing from the state/value they were in at the moment the 3D application is stopped.

Processing logic, now having access to a static state of each of the dynamic state records, then copies the dynamic state records into a location in NVRAM (processing block 1012). Because NVRAM is a directly addressable memory the dynamic state records are copied using a standard memory store operation, that while being slower than a comparable memory store operation to volatile memory, is much faster than storage to traditional rotating non-volatile media. Then processing logic suspends active operation of NVRAM and volatile memory to allow for the computing device to enter a low power state (processing block 1014). Once in the low power state, processing logic waits for an indication to resume the device (processing block 1016).

Once a resume command is received, processing logic resumes active operation of the NVRAM and volatile memory. Although volatile memory would no longer have a copy of the dynamic state records if it had been powered down, NVRAM does have the copy that was saved during the suspend task and so processing logic copies the dynamic state records from NVRAM back into volatile memory (processing block 1020). This step can be accomplished at an even faster rate than the store on suspend task because NVRAM has near volatile memory read speeds and volatile memory can store data at a very fast rate. Thus, at this point processing logic can restart the 3D application 1022 and resume its operation from the exact operational state it was in at the time it was suspended.

Although FIG. 9 and FIG. 10 are described specifically through the use of a 3D graphics application, this same methodology may be utilized for different types of graphics applications. For example, another potential usage would be to utilize this process during the playback of a media file, such as while watching a movie on the computing device.

1.G. Improved Image Fidelity

A current limitation of standard approaches to rendering with 3D applications is the limited size of high-speed GPU addressable memory (e.g., GDDR5), which is a very limited resource. A limited amount of memory is available for use by a 3D application, primarily due to cost. Given the higher capacity and lower overall cost of NVRAM in relationship to standard GPU-centric volatile memory, alternative rendering approaches are utilized in different embodiments. For example, significantly larger texture resources may be utilized when large capacity NVRAM can store those resources at a fraction of the cost and maintain similar memory read latency to volatile memory. As a result, the quality of the image produced by the GPU can be greatly increased. This is because the GPU can render an image with such detailed texture that it can closely or exactly reflect the an artist's originally created image. Today, the number of pixels in a texture file are reduced to decrease the file size to fit more efficiently in the volatile memory's limited space requirements. To compensate for the smaller memory signature, visual fidelity of a given texture resource is reduced by reducing the number of pixels in the texture. Thus, using NVRAM to allow an Increase in the number of pixels per texture will restore higher image fidelity.

2. Alternative Graphics Subsystem Memory Augmentation Embodiments

Although FIG. 1 illustrates a common embodiment of a system used to augment volatile memory with NVRAM for graphical applications, there are many other potential system configurations that essentially can accomplish the same result. Therefore. FIG. 11 through FIG. 15 show a number of alternative system configuration embodiments.

Figure 11:
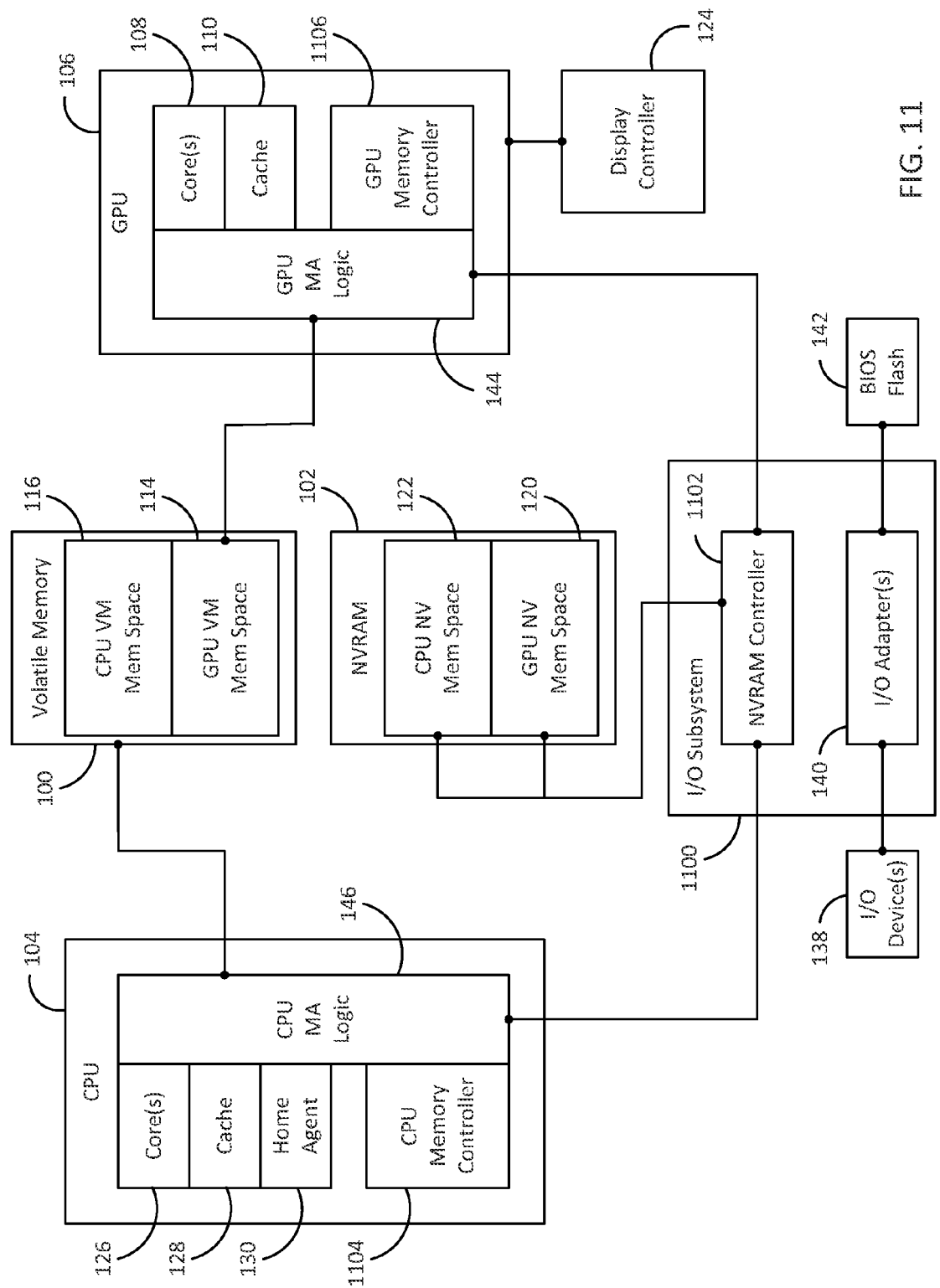
FIG. 11 through FIG. 15 illustrate alternative embodiments of a memory arrangement that allows at least a GPU access to both volatile and non-volatile forms of memory for graphics subsystem memory augmentation.

FIG. 11 illustrates an alternative embodiment of a memory arrangement that allows a CPU and a GPU access to both volatile and non-volatile forms of memory for graphics subsystem memory augmentation. Unlike the embodiment illustrated in FIG. 1, in FIG. 11 the I/O subsystem 1100 is housed in a discrete package (e.g. an I/O Controller Hub (ICH) package). Additionally, in the embodiment shown in FIG. 11, there is a single NVRAM controller 1102 that is shared between the CPU 104 and GPU 106 to obtain access to the NVRAM 102. The NVRAM controller 202 is located in the discrete I/O subsystem 1100 package rather than being integrated into the CPU 104 and GPU 106 packages.

In many embodiments related to FIG. 11, the CPU package therefore includes a memory controller 1104 specifically utilized for access to volatile memory 100 and the GPU package also includes a memory controller 1106 specifically utilized for access to volatile memory 100.

Figure 12:
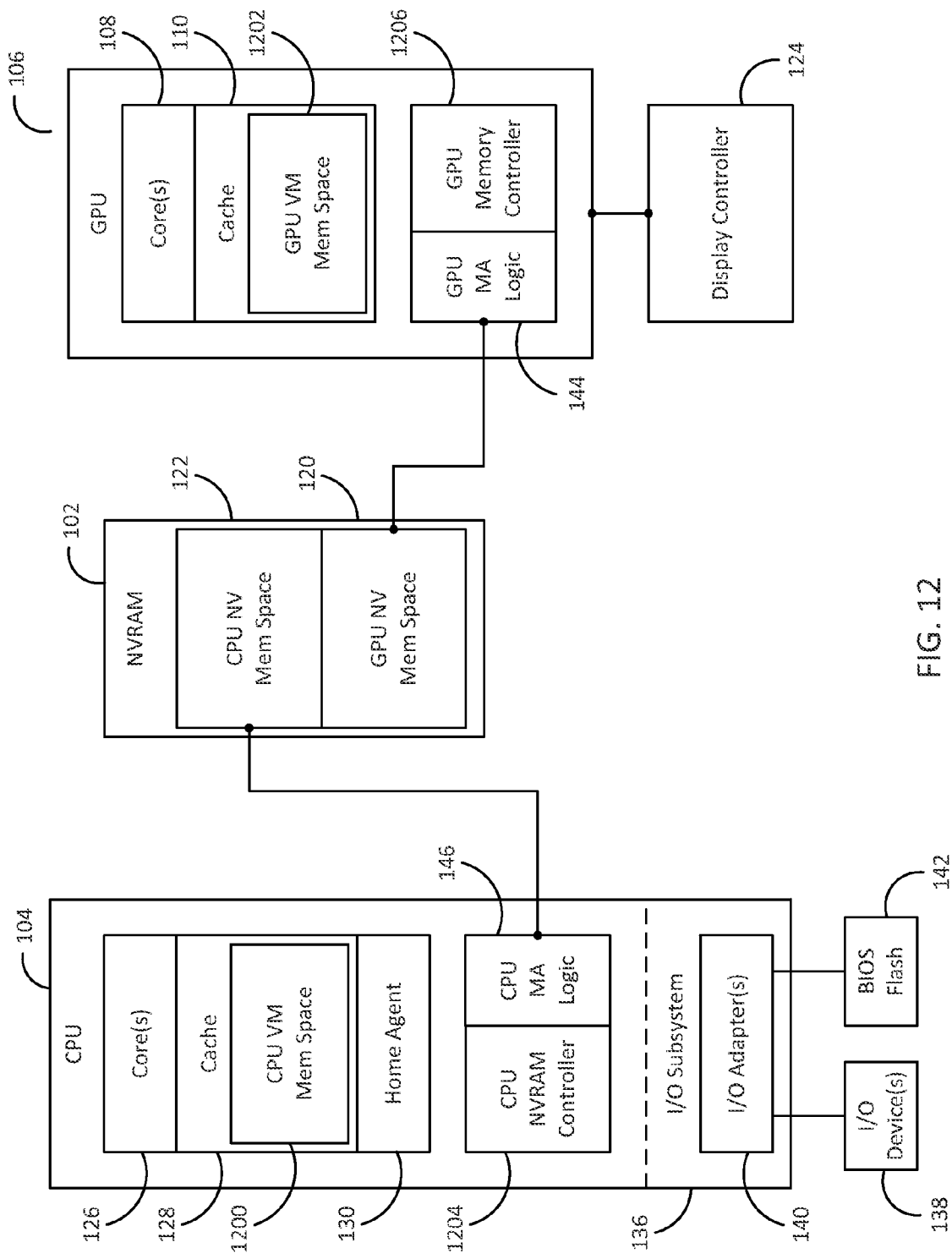

FIG. 12 illustrates an alternative embodiment of a memory arrangement that allows a CPU and a GPU access to both volatile and non-volatile forms of memory for graphics subsystem memory augmentation. Unlike the embodiments illustrated in FIG. 1 and FIG. 11, in FIG. 12 the volatile memory is contained exclusively within one or more caches within the CPU and GPU packages. In many embodiments, the cache(s) may expand in size significantly enough to lessen the impact of a lack of discrete volatile memory available to the computing device.

In many embodiments related to FIG. 12, the CPU package therefore includes a NVRAM controller 1204 specifically utilized for access to NVRAM 102 and the GPU package also includes a NVRAM controller 1206 specifically utilized for access to volatile memory 100.

Figure 13:
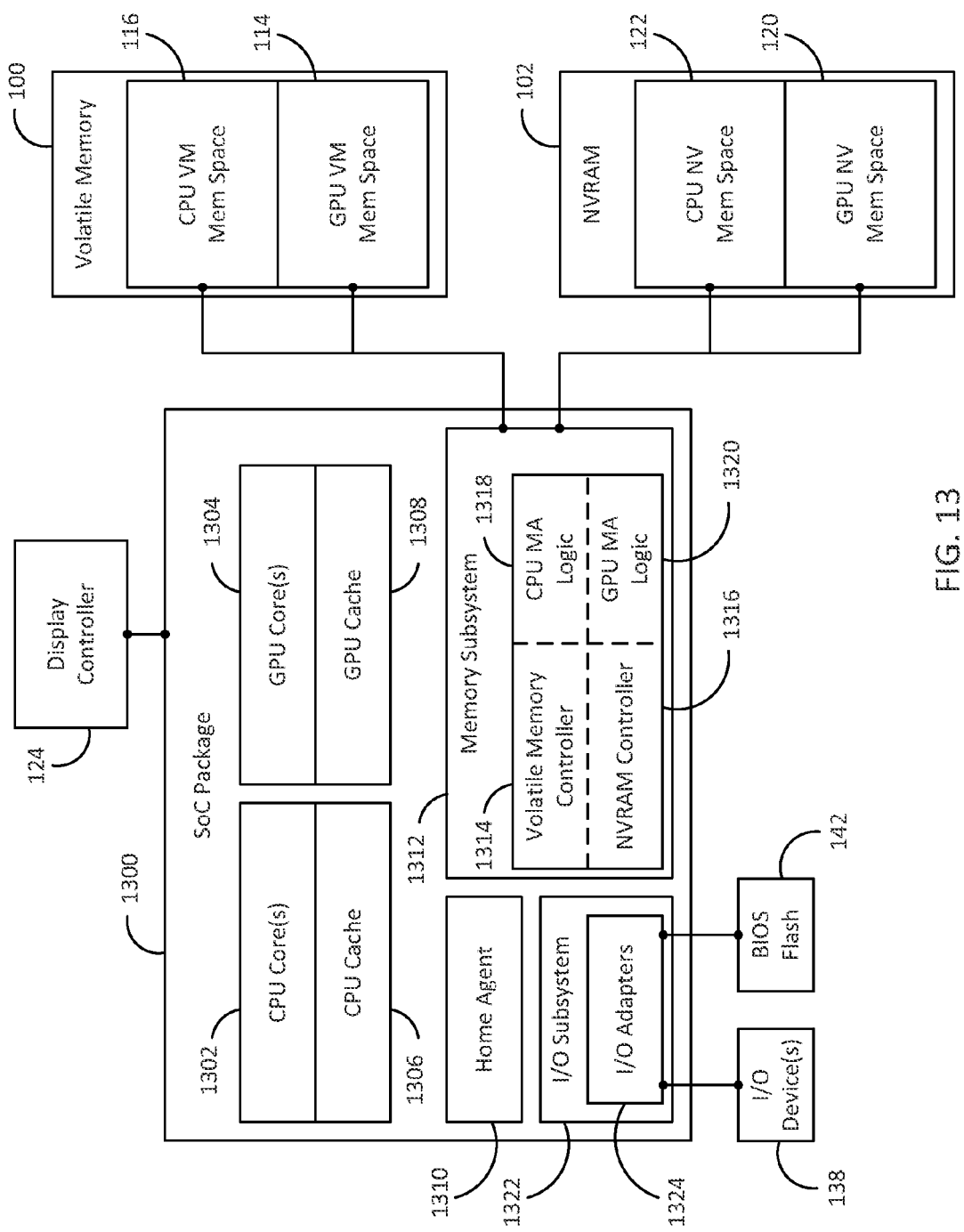

FIG. 13 illustrates an alternative embodiment of a memory arrangement that allows a CPU and a GPU access to both volatile and non-volatile forms of memory for graphics subsystem memory augmentation. Unlike the embodiments illustrated in the previous figures, in FIG. 11 the computing device is utilizing a system-on-a-chip (SoC) package, which combines all logic in the same SoC package 1300. Thus, CPU core(s) 1302, the GPU core(s) 1304, their respective caches (1306 and 1308), the Home Agent 1310, the memory subsystem 1312 that includes the volatile memory controller 1314, NVRAM controller 1316, CPU MA logic 1318, and GPU MA logic 1320, as well as the I/O subsystem 1322 with the I/O adapters 1324 all reside within the SoC package 1300. There may be additional logic, such as display controller 124 also in the SoC package 1300, though that is not shown in FIG. 13.

Figure 14:
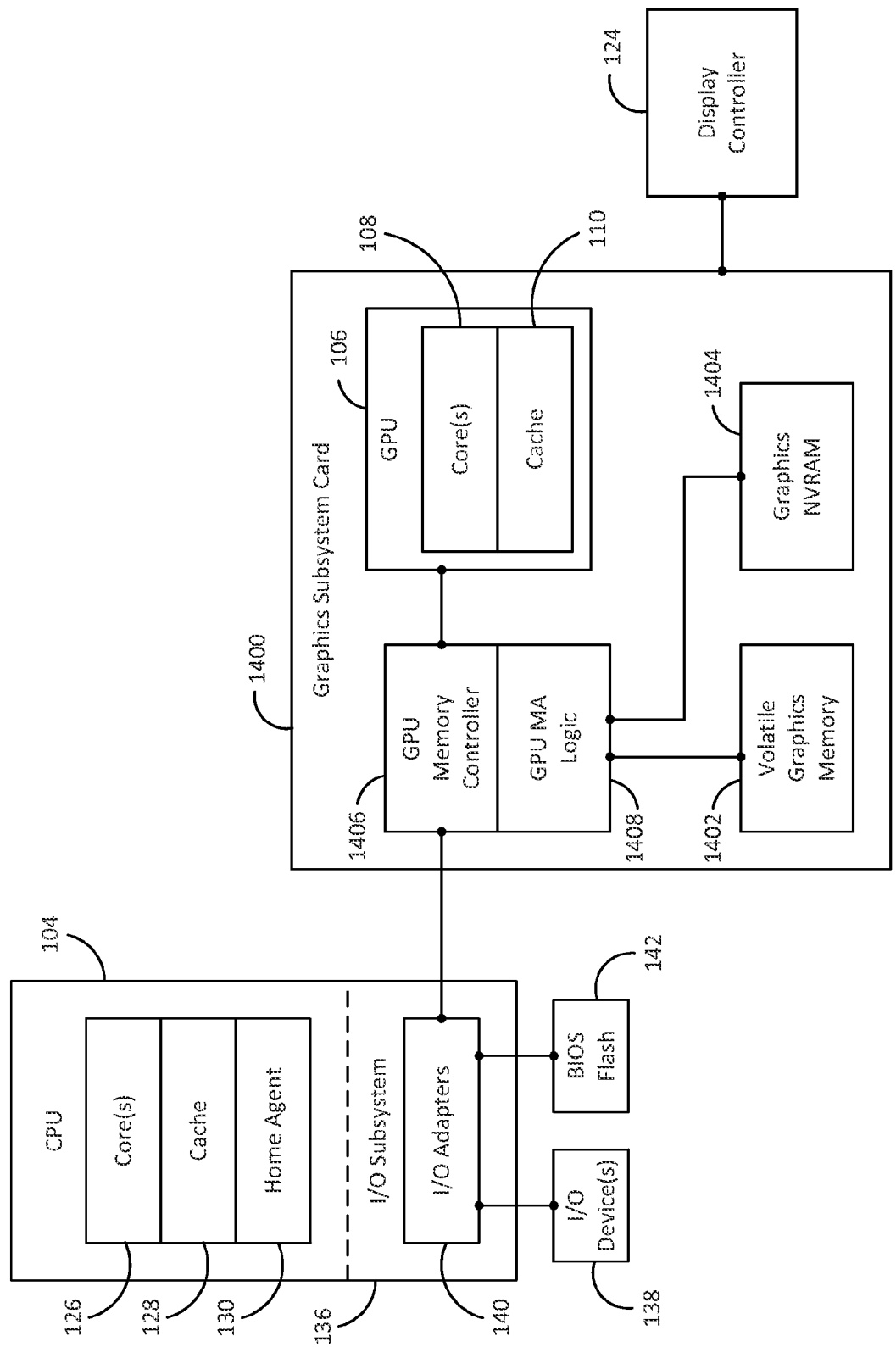

FIG. 14 illustrates an alternative embodiment of a memory arrangement that allows at least a GPU access to both volatile and non-volatile forms of memory for graphics subsystem memory augmentation. Unlike the embodiments illustrated in the previous figures, FIG. 14 illustrates the graphics subsystem 1400 entirely on a discrete card, which includes separate volatile graphics memory 1402 and graphics NVRAM 1406. For many high end applications, a graphics card (e.g. plugged into a PCI-Express slot on a motherboard) may contain the entire graphics subsystem and in these cases a separate amount of NVRAM may be located on the card. The same memory augmentation concepts apply except in embodiments illustrated in FIG. 14, the graphics subsystem card 1400 is coupled to the CPU 104 through the I/O subsystem 136. Thus, for example, the CPU may send a request to the GPU using a PCI-Express I/O adapter 140 as the communication method. In this scenario, the GPU memory controller 1406 can then route the request to the GPU 106. Additionally, the GPU 106, when requesting access to memory, sends the request to the GPU memory controller 1406, which then accesses either volatile graphics memory 1402 or graphics NVRAM 1404 through GPU MA logic 1408. In some embodiments, the CPU may be running a GFX memory manager (shown in FIG. 2 as 208A), which performs memory augmentation management functions, as discussed in FIG. 2.

Figure 15:
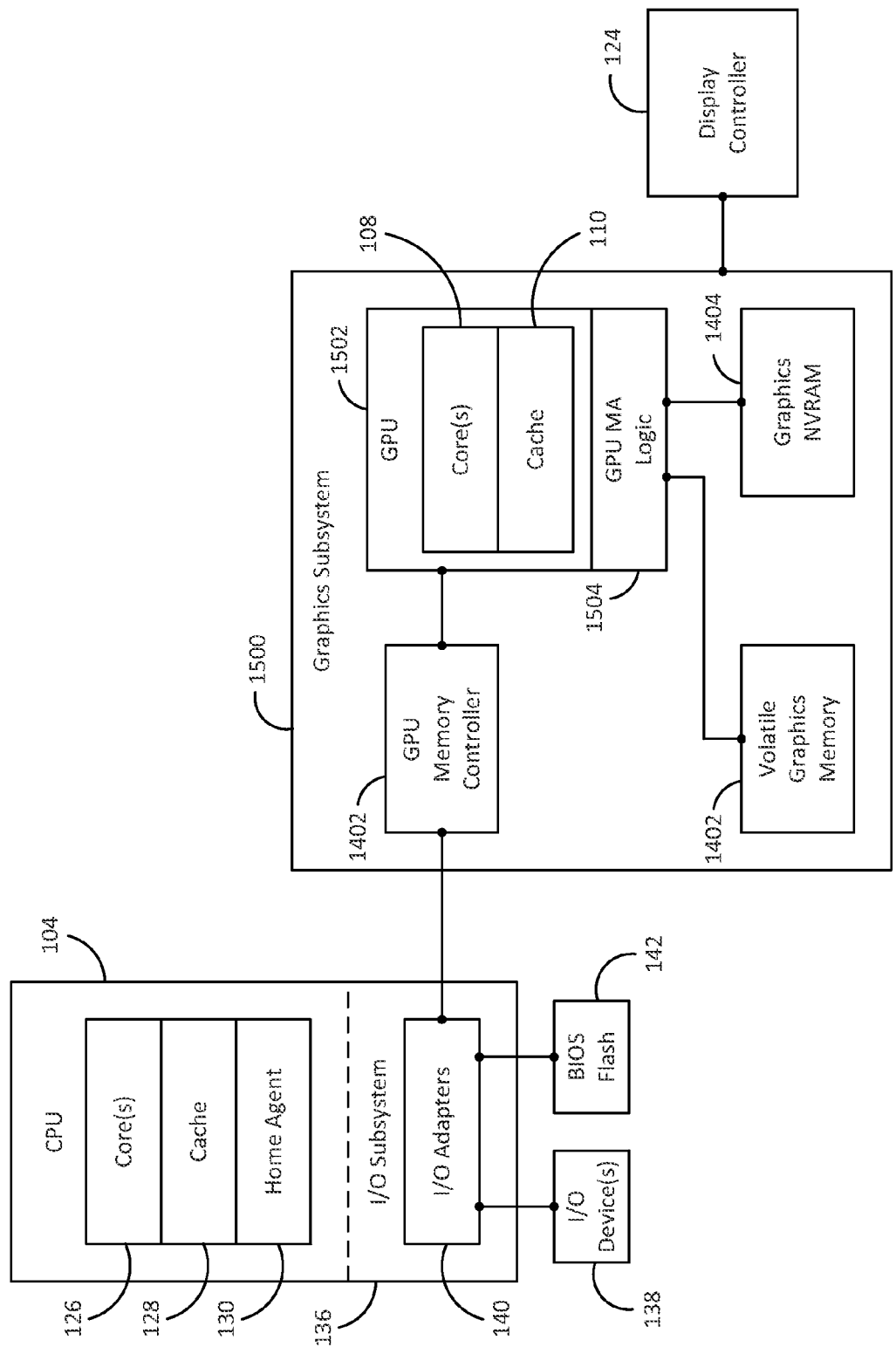

FIG. 15 illustrates an alternative embodiment of a memory arrangement that allows at least a GPU access to both volatile and non-volatile forms of memory for graphics subsystem memory augmentation. The embodiment in FIG. 15 is similar to the embodiment shown in FIG. 14 in that the graphics subsystem 1500 is entirely on a discrete card. Though, in the embodiment illustrated in FIG. 15, the GPU may be running the GFX memory manager code locally (shown in FIG. 2 as 208B). In these embodiments, the GPU 1502 can independently manage the memory augmentation scheme between volatile graphics memory 1402 and graphics NVRAM 1404 through GPU MA logic 1504 as well as the GFX memory manager code (shown in FIG. 2).

In the following description, numerous specific details such as logic implementations, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

Embodiments of the invention may also be provided as a computer program product which may include a non-transitory machine-readable medium having stored thereon instructions which may be used to program a computer (or other electronic device) to perform a process. The non-transitory machine-readable medium may include, but is not limited to, floppy diskettes, optical disks, CD-ROMs, and magneto-optical disks. ROMs. RAMs, EPROMs. EEPROMs, magnet or optical cards, propagation media or other type of media/machine-readable medium suitable for storing electronic instructions. Embodiments of the invention may also be downloaded as a computer program product, wherein the program may be transferred from a remote computer (e.g. a server) to a requesting computer (e.g. a client) by way of data signals embodied in a carrier wave or other propagation medium via a communication link (e.g., a modem or network connection).

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

We claim:

1. A method comprising:
    storing one or more static or near-static graphics resources in a non-volatile random access memory (NVRAM), the NVRAM being directly accessible by a graphics processor using at least memory store and load commands;
    executing, by a graphics processor, a graphics application, wherein the graphics processor sends a request using a memory load command for an address corresponding to at least one of the one or more static or near-static graphics resources stored in the NVRAM;
    in response to the memory load command, directly loading the requested graphics resource from the NVRAM into a cache for the graphics processor;
    storing a graphics processor memory management unit address map in a volatile memory location accessible to a graphics memory manager logic component;
    managing, by the graphics memory manager logic component, a logical address to physical address map for each of a plurality of graphics resources related to the graphics application, the one or more static or near-static graphics resources being part of the plurality of graphics resources related to the graphics application; and
    including, by the graphics memory manager logic component, a static/near-static tag for each of the plurality of graphics resources in the graphics processor memory management unit address map, the static/near-static tag indicating the resource will not be dynamically changing in a frequent manner.

2. The method of claim 1, further including:
    sending to the graphics memory manager logic component, by a central processing unit, an update to the static/near-static tag for at least a first graphics resource of the plurality of graphics resources; and
    in response to receiving the update to the static/near-static tag for at least the first graphics resource, initiating, by the graphics memory manager logic component, a physical movement of the first graphics resource between the NVRAM and the volatile memory.

3. The method of claim 1, further including:
    storing translation lookaside buffer entries in the graphics processor memory management unit address map.

4. The method of claim 1, wherein the NVRAM includes one or more of phase change memory, byte-addressable persistent memory, universal memory, Ge2Sb2Te5 memory, programmable metallization cell memory, resistive memory, amorphous cell memory, Ovshinsky memory, ferroelectric memory, ferromagnetic memory, spin transfer torque memory, spin tunneling memory, magnetoresistive memory, magnetic memory, or dielectric memory.

5. A method comprising:
    executing a graphics application on a graphics processor, wherein during execution there are one or more dynamic state records, utilized by the graphics application, stored in a volatile memory and at least one or more static or near-static graphics resources, utilized by the graphics application, stored in a non-volatile random access memory (NVRAM), the NVRAM being directly accessible by the graphics processor using at least memory store and load commands;
    receiving a notification to suspend the graphics processor, the NVRAM, and the volatile memory;
    in response to the notification to suspend, performing a first memory copy of the one or more dynamic state records from the volatile memory to the NVRAM;
    after the one or more dynamic state records have been copied into the NVRAM, suspending the graphics processor, the NVRAM, and the volatile memory into a lower power state;
    receiving a notification to resume the graphics processor, the NVRAM, and the volatile memory;
    in response to the notification to resume, resuming the graphics processor, the NVRAM, and the volatile memory into an operational state;
    performing a second memory copy of the one or more dynamic state records from the NVRAM back into the volatile memory; and
    resuming execution of the graphics application.

6. The method of claim 5, wherein the suspending to the lower power state further includes suspending to a non-powered state.

7. The method of claim 5, further including:
    building the one or more dynamic state records during an initial startup of execution of the graphics application; and thereafter not rebuilding the one or more dynamic state records during any subsequent resumption of execution of the graphics application after a suspension of the graphics processor, the NVRAM, and the volatile memory.

8. The method of claim 5, wherein the NVRAM includes one or more of phase change memory, byte-addressable persistent memory, universal memory, Ge2Sb2Te5 memory, programmable metallization cell memory, resistive memory, amorphous cell memory, Ovshinsky memory, ferroelectric memory, ferromagnetic memory, spin transfer torque memory, spin tunneling memory, magnetoresistive memory, magnetic memory, or dielectric memory.

9. A method, comprising:
storing display image data in at least one frame buffer in a non-volatile random access memory (NVRAM), the NVRAM being directly accessible by a graphics processor using at least memory store and load commands;
performing, by a display controller, a memory load on the frame buffer to receive the display image data, the storing of the display image data in the NVRAM occurring at least as frequently as a refresh rate of a display screen;
displaying, by the display controller, the received display image data on the display screen; and
when the display controller is first capable of sending an image to the display screen during a system boot, displaying an image that was stored in a local display NVRAM of the display controller during an operational period of time prior to the system boot.

10. The method of claim 9, wherein the NVRAM includes one or more of phase change memory, byte-addressable persistent memory, universal memory, Ge2Sb2Te5 memory, programmable metallization cell memory, resistive memory, amorphous cell memory, Ovshinsky memory, ferroelectric memory, ferromagnetic memory, spin transfer torque memory, spin tunneling memory, magnetoresistive memory, magnetic memory, or dielectric memory.

11. A device comprising:
graphics processor memory augmentation logic to:
store one or more static or near-static graphics resources in a non-volatile random access memory (NVRAM), the NVRAM being directly accessible by a graphics processor using at least memory store and load commands, and
store a graphics processor memory management unit address map in a volatile memory location accessible to a graphics memory manager logic component;
a graphics processor to execute a graphics application, the graphics processor to at least send a request using a memory load command for an address corresponding to at least one of the one or more static or near-static graphics resources stored in the NVRAM;
a graphics memory controller to, in response to the memory load command, directly load the requested graphics resource from the NVRAM into a cache for the graphics processor; and
the graphics memory manager logic component to:
manage a logical address to physical address map for each of a plurality of graphics resources related to the graphics application, the one or more static or near-static graphics resources being part of the plurality of graphics resources related to the graphics application, and
include a static/near-static tag for each of the plurality of graphics resources in the graphics processor memory management unit address map, the static/near-static tag to indicate the resource will not dynamically change in a frequent manner.

12. The device of claim 11, wherein the graphics memory manager logic component is further to:
receive, from a central processing unit, an update to the static/near-static tag for at least a first graphics resource of the plurality of graphics resources; and
initiate a physical movement of the first graphics resource between the NVRAM and the volatile memory in response to receiving the update to the static/near-static tag for at least the first graphics resource.

13. The device of claim 11, wherein the graphics memory manager logic component is further to store translation lookaside buffer entries in the graphics processor memory management unit address map.

14. The device of claim 11, wherein the NVRAM includes one or more of phase change memory, byte-addressable persistent memory, universal memory, Ge2Sb2Te5 memory, programmable metallization cell memory, resistive memory, amorphous cell memory, Ovshinsky memory, ferroelectric memory, ferromagnetic memory, spin transfer torque memory, spin tunneling memory, magnetoresistive memory, magnetic memory, or dielectric memory.

15. A device comprising:
a graphics processor to execute a graphics application, wherein during execution there are one or more dynamic state records, utilized by the graphics application, stored in a volatile memory and at least one or more static or near-static graphics resources, utilized by the graphics application, stored in a non-volatile random access memory (NVRAM), the NVRAM being directly accessible by the graphics processor using at least memory store and load commands;
graphics processor memory augmentation logic to:
receive a notification to suspend the graphics processor, the NVRAM, and the volatile memory;
in response to the notification to suspend, perform a first memory copy of the one or more dynamic state records from the volatile memory to the NVRAM;
after the one or more dynamic state records have been copied into the NVRAM, suspend the graphics processor, the NVRAM, and the volatile memory into a low power state;
receive a notification to resume the graphics processor, the NVRAM, and the volatile memory;
in response to the notification to resume, resume the graphics processor, the NVRAM, and the volatile memory into an operational state; and
direct a graphics memory controller to perform a second memory copy of the one or more dynamic state records from the NVRAM back into the volatile memory; and
the graphics processor to resume execution of the graphics application.

16. The device of claim 15, wherein the graphics processor, the NVRAM, and the volatile memory are to suspend to the low power state by suspending to a non-powered state.

17. The device of claim 15, wherein the graphics processor is further to:
build the one or more dynamic state records during an initial startup of execution of the graphics application; and
thereafter not rebuild the one or more dynamic state records during any subsequent resumption of execution of the graphics application after a suspension of the graphics processor, the NVRAM, and the volatile memory.

18. The device of claim 15, wherein the NVRAM includes one or more of phase change memory, byte-addressable persistent memory, universal memory, Ge2Sb2Te5 memory, programmable metallization cell memory, resistive memory, amorphous cell memory, Ovshinsky memory, ferroelectric memory, ferromagnetic memory, spin transfer torque memory, spin tunneling memory, magnetoresistive memory, magnetic memory, or dielectric memory.

19. A system, comprising:
  graphics processor memory augmentation logic to store display image data in at least one frame buffer in a non-volatile random access memory (NVRAM), the NVRAM being directly accessible by a graphics processor using at least memory store and load commands;
  a display controller to perform a memory load on the frame buffer to receive the display image data, the storing of the display image data in the NVRAM to occur at least as frequently as a refresh rate of a display screen, and the display controller to display the received display image data on the display screen; and
  a local display NVRAM in the display controller to store one or more frame buffers locally within the display controller, and during a system boot, when the display controller is first capable of sending an image to the display screen, the display controller is to display an image that was last stored within the local display NVRAM during an operational period of time prior to the system boot.

20. The system of claim 19, wherein the NVRAM includes one or more of phase change memory, byte-addressable persistent memory, universal memory, Ge2Sb2Te5 memory, programmable metallization cell memory, resistive memory, amorphous cell memory, Ovshinsky memory, ferroelectric memory, ferromagnetic memory, spin transfer torque memory, spin tunneling memory, magnetoresistive memory, magnetic memory, or dielectric memory.

* * * * *